US007385655B2

(12) United States Patent
Imai et al.

(10) Patent No.: US 7,385,655 B2
(45) Date of Patent: Jun. 10, 2008

(54) ELECTRONIC CIRCUIT DEVICE WITH OPTICAL SENSORS AND OPTICAL SHUTTERS AT SPECIFIC LOCATIONS

(75) Inventors: Shigeki Imai, Nara (JP); Tomoyuki Nagai, Tenri (JP); Shunpei Yamazaki, Setagaya (JP); Jun Koyama, Sagamihara (JP)

(73) Assignees: Semiconductor Energy Laboratory Co., Ltd., Kanagawa-ken (JP); Sharp Kabushiki Kaisha, Osaka (JP)

( * ) Notice: Subject to any disclaimer, the term of this patent is extended or adjusted under 35 U.S.C. 154(b) by 65 days.

(21) Appl. No.: 10/649,637

(22) Filed: Aug. 28, 2003

(65) Prior Publication Data

US 2004/0061126 A1 Apr. 1, 2004

(30) Foreign Application Priority Data

Sep. 2, 2002 (JP) .............................. 2002-257212

(51) Int. Cl.
*G02F 1/1347* (2006.01)
(52) U.S. Cl. .............................. 349/74; 349/24; 349/28
(58) Field of Classification Search ................. 349/17; 359/107, 108
See application file for complete search history.

(56) References Cited

U.S. PATENT DOCUMENTS

| 3,348,056 | A | 10/1967 | Kohashi |
| 3,976,877 | A | 8/1976 | Thillays |
| 4,058,821 | A | 11/1977 | Miyoshi et al. |
| 4,612,083 | A | 9/1986 | Yasumoto et al. |

(Continued)

FOREIGN PATENT DOCUMENTS

DE 199 63 165 3/2001

(Continued)

OTHER PUBLICATIONS

European Search Report dated Apr. 8, 2004 for Application No. 03 00 9851.

(Continued)

*Primary Examiner*—Andrew Schechter
*Assistant Examiner*—Lucy P Chien
(74) *Attorney, Agent, or Firm*—Eric J. Robinson; Robinson Intellectual Property Law Office, P.C.

(57) ABSTRACT

An object of the present invention is to provide an electronic circuit device capable of reducing the occurrence of electromagnetic waves accompanying the propagation of a signal. The electronic circuit device comprises a plurality of transparent substrates, on which an optical sensor and an optical shutter are formed. An optical signal is inputted from the external into the electronic circuit device, and the optical signal is directly irradiated on the optical sensor disposed on the transparent substrate, or the optical signal is transmitted through the transparent substrate and inputted into an optical sensor on the other substrate. The optical sensor converts the optical signal into an electric signal, and the circuit disposed on the substrate is operated. The optical shutter is controlled by the output of the circuit, the light is inputted from the external into this optical shutter, and whether the light has been transmitted or not is determined, thereby taking out the signal. In this way, by reducing electric signals for input and output, the occurrence of unnecessary electromagnetic waves is prevented.

14 Claims, 18 Drawing Sheets

U.S. PATENT DOCUMENTS

| | | | |
|---|---|---|---|
| 4,766,471 A | | 8/1988 | Ovshinsky et al. |
| 4,811,210 A | * | 3/1989 | McAulay .................... 710/317 |
| 4,823,178 A | * | 4/1989 | Suda .......................... 257/444 |
| 4,830,444 A | * | 5/1989 | Cloonan et al. ............ 359/107 |
| 4,843,587 A | * | 6/1989 | Schlunt et al. .............. 708/835 |
| 4,851,695 A | | 7/1989 | Stein |
| 4,888,625 A | | 12/1989 | Mueller |
| 4,894,699 A | | 1/1990 | Hayashi et al. |
| 4,988,891 A | * | 1/1991 | Mashiko ...................... 326/36 |
| 5,008,554 A | * | 4/1991 | Asakawa et al. ........... 250/551 |
| 5,095,380 A | * | 3/1992 | Kawai ......................... 359/107 |
| 5,200,631 A | | 4/1993 | Austin et al. |
| 5,249,245 A | | 9/1993 | Lebby et al. |
| 5,262,980 A | * | 11/1993 | Shannon .................... 356/108 |
| 5,266,794 A | * | 11/1993 | Olbright et al. ...... 250/214 LS |
| 5,268,679 A | * | 12/1993 | Shannon ........................ 345/4 |
| 5,291,324 A | * | 3/1994 | Hinterlong ................... 398/54 |
| 5,297,232 A | * | 3/1994 | Murphy ........................ 706/26 |
| 5,339,090 A | * | 8/1994 | Crossland et al. ............ 345/90 |
| 5,353,247 A | * | 10/1994 | Faris .......................... 365/108 |
| 5,357,122 A | | 10/1994 | Okubora et al. |
| 5,362,961 A | * | 11/1994 | Hamanaka .................. 250/216 |
| 5,383,042 A | * | 1/1995 | Robinson ..................... 349/17 |
| 5,410,502 A | * | 4/1995 | Bird ............................ 365/108 |
| 5,478,658 A | | 12/1995 | Dodabalapur et al. |
| 5,483,263 A | | 1/1996 | Bird et al. |
| 5,488,735 A | | 1/1996 | Tanabe et al. |
| 5,491,571 A | * | 2/1996 | Williams et al. .............. 349/42 |
| 5,502,837 A | | 3/1996 | Hoffert |
| 5,523,704 A | * | 6/1996 | So ................................ 326/30 |
| 5,546,209 A | * | 8/1996 | Willner et al. ................ 398/43 |
| 5,583,570 A | * | 12/1996 | Yamada ...................... 348/294 |
| 5,654,559 A | | 8/1997 | Spaeth et al. |
| 5,705,829 A | | 1/1998 | Miyanaga et al. |
| 5,738,731 A | * | 4/1998 | Shindo et al. .............. 136/249 |
| 5,832,147 A | * | 11/1998 | Yeh et al. ..................... 385/14 |
| 5,848,214 A | | 12/1998 | Haas et al. |
| 6,111,902 A | | 8/2000 | Kozlov et al. |
| 6,140,165 A | | 10/2000 | Zhang et al. |
| 6,160,828 A | | 12/2000 | Kozlov et al. |
| 6,627,953 B1 | | 9/2003 | Vu et al. |
| 6,653,157 B2 | | 11/2003 | Kondo |
| 6,661,940 B2 | * | 12/2003 | Kim ............................ 385/15 |
| 6,730,933 B1 | | 5/2004 | Shimizu et al. |
| 2001/0006503 A1 | | 7/2001 | Braitberg et al. |
| 2002/0009274 A1 | | 1/2002 | Gharavi |
| 2002/0027206 A1 | | 3/2002 | Yuan et al. |
| 2002/0158263 A1 | | 10/2002 | Tanaka et al. |
| 2002/0159487 A1 | | 10/2002 | Thornton et al. |
| 2003/0002826 A1 | | 1/2003 | Cohen et al. |
| 2003/0122137 A1 | | 7/2003 | Hashimoto |
| 2003/0139520 A1 | | 7/2003 | Toyama et al. |
| 2003/0218174 A1 | | 11/2003 | Verdonk et al. |
| 2003/0218418 A9 | | 11/2003 | Sato et al. |
| 2004/0007706 A1 | | 1/2004 | Yamazaki et al. |
| 2004/0012016 A1 | | 1/2004 | Underwood et al. |
| 2004/0042707 A1 | | 3/2004 | Imai et al. |
| 2004/0061126 A1 | | 4/2004 | Imai et al. |
| 2004/0195572 A1 | | 10/2004 | Kato et al. |
| 2005/0006648 A1 | | 1/2005 | Yamazaki et al. |
| 2005/0048320 A1 | | 3/2005 | Kobayashi |
| 2006/0082627 A9 | | 4/2006 | Bright et al. |

FOREIGN PATENT DOCUMENTS

| | | |
|---|---|---|
| EP | 0 633 542 | 1/1995 |
| EP | 0 683 623 | 11/1995 |
| EP | 1 154 676 | 11/2001 |
| EP | 1 281 690 | 2/2003 |
| JP | 02-136805 | 5/1990 |
| JP | 02-262357 | 10/1990 |
| JP | 02-299259 | 12/1990 |
| JP | 05-037357 | 2/1993 |
| JP | 05-152608 | 6/1993 |
| JP | 05-343183 | 12/1993 |
| JP | 06-029924 | 2/1994 |
| JP | 06-347836 | 12/1994 |
| JP | 09-246509 | 9/1997 |
| JP | 10-051387 | 2/1998 |
| JP | 10-063807 | 3/1998 |
| JP | 2000-058259 | 2/2000 |
| JP | 2000-058882 | 2/2000 |
| JP | 2000-277794 | 10/2000 |
| JP | 2002-100758 | 4/2002 |
| JP | 3397565 | 4/2003 |
| JP | 2003-168567 | 6/2003 |
| KR | 95-4420 | 4/1995 |
| WO | WO 98/50989 | 11/1998 |
| WO | WO 01/33487 | 5/2001 |
| WO | WO 01/39554 | 5/2001 |
| WO | WO 01/64598 | 9/2001 |
| WO | WO 02/31882 | 4/2002 |
| WO | WO 02/071557 | 9/2002 |

OTHER PUBLICATIONS

J.A. Rogers et al., *Organic Smart Pixels and Complementary Inverter Circuits Formed on Plastic Substrates by Casting and Rubber Stamping,* IEEE Electron Devices Letters, vol. 21, No. 3, Mar. 2000, pp. 100-103.

C. Wu et al., *P-19: Design of a Novel α-Si PIN/OLED Image Sensor & Display Device,* SID Digest '99, SID International Symposium Digest of Technical Papers, pp. 528-531.

European Search Report dated Jul. 1, 2004 for Application No. 03 00 9851.

Specification and drawings of U.S. Appl. No. 10/649,661 entitled *Electronic Circuit Device,* filed Aug. 28, 2003, 46 pages, Official Filing Receipt.

N. Tessler, *Lasers Based on Semiconducting Organic Materials,* Advanced Materials, 1999, vol. 11, No. 5, pp. 363-370.

*Crystalline Colloidal Array Fabrication,* http://www.personal.psu.edu/mkm20/cca.html.

*Diffraction by a Periodic Structure,* http://www.wias-berlin.de/people/schmidt/diffpage/index.html.

* cited by examiner

ELECTRONIC CIRCUIT DEVICE WITH OPTICAL SENSORS AND OPTICAL SHUTTERS AT SPECIFIC LOCATIONS

BACKGROUND OF THE INVENTION

1. Field of the Invention

The present invention relates to an electronic circuit device for light input, and particularly, relates to an electronic circuit device for light input, which has been constituted by forming a thin film transistor on a transparent substrate such as substrate made of quartz, glass, plastic, and the like. Moreover, the present invention relates to an electronic device such as a computer or the like constituted with the electronic circuit devices.

2. Description of Related Art

At the present day, the informarization has been furthermore progressing by the progresses of electronic devices. It is expected that this tendency will be further promoted from now on. In general, an electronic circuit device which configures an electronic device and is popular among the people at present configures the circuit on a printed circuit board. Specifically, a metal such as copper (Cu) or the like is galvanized on a substrate formed with glass epoxy or the like, and then, a wiring which is a part is formed by etching it. Then, after the printed circuit board has been formed, an electronic part such as a LSI (Large Scale Integrated circuit), a resistance, a condenser or the like is inserted and connected by performing the soldering. As for such a printed circuit board, a method of fabricating it is easy and is frequently used.

Moreover, on the other hand, the performance of electronic devices has been enhanced from the viewpoint of the operation rate, and further the enhancement of the operation rate has been required.

In FIG. 10, the conventional well known electronic circuit device will be described below. The conventional electronic circuit device shown in FIG. 10 is configured with electronic substrates 1001, 1002, and 1003. The electronic substrate 1001 is fabricated by the procedure that a cupper (Cu) foil is patterned on a glass epoxy substrate, electronic parts 1010-1020 such as a LSI (Large Scale Integrated circuit), a resistance, a condenser and the like are disposed, and connected. In the case of electronic substrates 1002 and 1003, these are also similarly fabricated. Moreover, the electronic substrate 1001 is also inserted into sockets 1004, 1005 and 1006, and the sockets are connected to each other via wirings 1007, 1008. And a wiring 1009 is connected to an external circuit.

In the conventional electronic circuit devices as described above, there have been the following problems: first, there has been a case where a strong electromagnetic wave is generated from a LSI or the like which has been mounted on the electronic circuit substrate. Moreover, a strong electromagnetic wave has been also generated in a connecting line for connecting electronic circuit substrates as well as the electronic circuit substrate. There have been problems that such an electromagnetic wave has a bad influence on the other electronic parts (not shown) which is located at the external of the electronic circuit device, wrong operations of these are caused, the performance becomes worse, and so forth. Such problems have significantly manifested in their severe forms as the electronic circuit operates at higher rate and as the scale of the electronic circuit becomes larger.

SUMMARY OF THE INVENTION

An object of the present invention is to solve the problems such as the occurrence of noises and the occurrence of wrong operations caused by such an electromagnetic wave.

In order to solve the above-described problems, in the present invention, an electronic circuit substrate which configures an electronic circuit device is configured with a transparent substrate, the signal is made optically inputted, an optical shutter or an optical sensor is provided and set on the transparent substrate, and the transmission and receiving of a signal are performed using a light, whereby the occurrence of unnecessary electromagnetic waves is prevented.

An electronic circuit device of the present invention comprises a plurality of transparent substrates, and an optical sensor and an optical shutter are formed on the substrate. An optical signal is inputted from the external to the electronic circuit device, the optical signal is directly irradiated on the optical sensor disposed on the transparent substrate or the optical signal is transmitted through the transparent substrate and inputted into an optical sensor disposed on the other substrate. The optical sensor converts the optical signal into an electric signal, and the circuit disposed on the substrate is operated. The output of the circuit controls the optical shutter, the input of light is carried out from the external to this optical shutter, and whether the light has been transmitted through the optical shutter or the light has been interrupted is determined, thereby taking out a signal. In this way, the unnecessary occurrence of electromagnetic waves is prevented by performing the input and output using an optical signal.

The present invention is characterized in that in an electronic circuit device having a plurality of electronic circuit substrates on which either of an optical shutter or an optical sensor is disposed, or both of them are disposed, the foregoing plurality of electronic circuit substrates comprise a transparent substrate, an optical signal is inputted from the external, the foregoing optical signal which has been inputted is inputted into the optical shutter or the optical sensor disposed on a transparent substrate which is different from the foregoing substrate after the foregoing optical signal has been transmitted through at the least one or more foregoing transparent substrates, the foregoing optical shutter controls the transmission and non-transmission of the foregoing optical signal and the optical sensor converts the foregoing optical signal into an electric signal by an electronic circuit on the same transparent substrate with the foregoing optical sensor.

The present invention is characterized in that in an electronic circuit device having a plurality of transparent substrates on which either of an optical shutter or an optical sensor is disposed, or both of them are disposed, said plurality of transparent substrates have been laminated, an optical signal is inputted from the external, the foregoing optical signal which has been inputted is inputted into the optical shutter or the optical sensor on the transparent substrate which is different from the foregoing substrate after the foregoing optical signal has been transmitted through at the least one or more foregoing transparent substrates, the foregoing optical shutter controls the transmission and non-transmission of the light, and the foregoing optical sensor converts the foregoing optical signal into an electric signal by the electronic circuit on the same transparent substrate with the foregoing optical sensor.

The present invention is characterized in that in an electronic circuit device having a plurality of transparent substrates on which either of an optical shutter or an optical sensor is disposed, or both of them are disposed, an optical signal is inputted from the external, the foregoing optical signal is directly inputted into the optical shutter disposed on the transparent substrate or the foregoing optical signal is inputted into the optical shutter disposed on the transparent substrate after the foregoing optical signal has been transmitted through the transparent substrate, in the case where the optical shutter has transmitted the foregoing optical signal, the optical signal which has been transmitted through the optical shutter is directly inputted into the optical sensor disposed on the transparent substrate or the optical signal is inputted into the optical sensor disposed on the transparent substrate after the optical signal has been transmitted through a transparent substrate which is different from the foregoing substrate.

The present invention is characterized in that in an electronic circuit device having a plurality of transparent substrates on which either of an optical shutter or an optical sensor is disposed, or both of them are disposed, by an electronic circuit disposed on the transparent substrate, the foregoing optical shutter is controlled, the optical signal which has been inputted from the external is inputted into the foregoing optical shutter, whether the foregoing optical signal has been transmitted through it or not is determined, thereby taking out the output signal of the foregoing electronic circuit.

The present invention is characterized in that in an electronic circuit device having a plurality of transparent substrates on which either of an optical shutter or an optical sensor is disposed, or both of them are disposed, the foregoing transparent substrate has been laminated, and then, by an electronic circuit on the foregoing transparent substrate, the foregoing optical shutter is controlled, the optical signal which has been inputted from the external is inputted into the foregoing optical shutter, and whether the foregoing optical signal has been transmitted or not transmitted through the foregoing optical shutter is determined, thereby taking out the output signal of the foregoing electronic circuit.

The present invention is characterized in that in a configuration of the above-described present invention, an electronic circuit on a transparent substrate is configured with a thin film transistor.

In the above-described configuration of the present invention, an electronic circuit disposed on the transparent substrate is characterized in that the foregoing electronic circuit is configured with a thin film transistor and a single crystal IC (Integrated Circuit) chip.

In the above-described configuration of the present invention, an optical sensor disposed on the transparent substrate is characterized in that the foregoing optical sensor is an amorphous silicon photodiode, or an amorphous silicon phototransistor.

In the above-described configuration of the present invention, an optical sensor disposed on the transparent substrate is characterized in that the foregoing optical sensor is a polysilicon (p-Si) photodiode, or a polysilicon phototransistor.

In the above-described configuration of the present invention, an optical sensor disposed on the transparent substrate is characterized in that the foregoing optical sensor is a single crystal silicon photodiode, or a single crystal silicon phototransistor.

In the above-described configuration of the present invention, the foregoing optical shutter is characterized in that it is composed of a liquid crystal which has been sandwiched between two sheets of transparent substrates.

In the above-described configuration of the present invention, the foregoing transparent substrate is characterized in that on the foregoing transparent substrate, a deflection plate is disposed, and the foregoing deflection plate is disposed only nearby the optical shutter.

The present invention is characterized in that in a computer having a plurality of arithmetic and logic units which is configured with a thin film transistor and a plurality of storage devices disposed on a plurality of transparent substrates, the exchange of electronic information performed between the foregoing substrates is carried out by an optical shutter and an optical sensor controlled by the thin film transistors.

The present invention is characterized in that in a computer having a plurality of arithmetic and logic units which is configured with a thin film transistor and a plurality of storage devices disposed on a plurality of transparent substrates, the exchange of electronic information performed between the foregoing substrates is carried out in parallel by an optical shutter and an optical sensor controlled by the thin film transistors.

BRIEF DESCRIPTION OF THE DRAWINGS

For a more complete understanding of the present invention and the advantages thereof, reference is now made to the following detailed description taken in conjunction with the accompanying drawings, in which.

DESCRIPTION OF THE PREFERRED EMBODIMENTS

Hereinafter, an electronic circuit device of the present invention will be described in detail with reference to the drawings.

Figure 1:
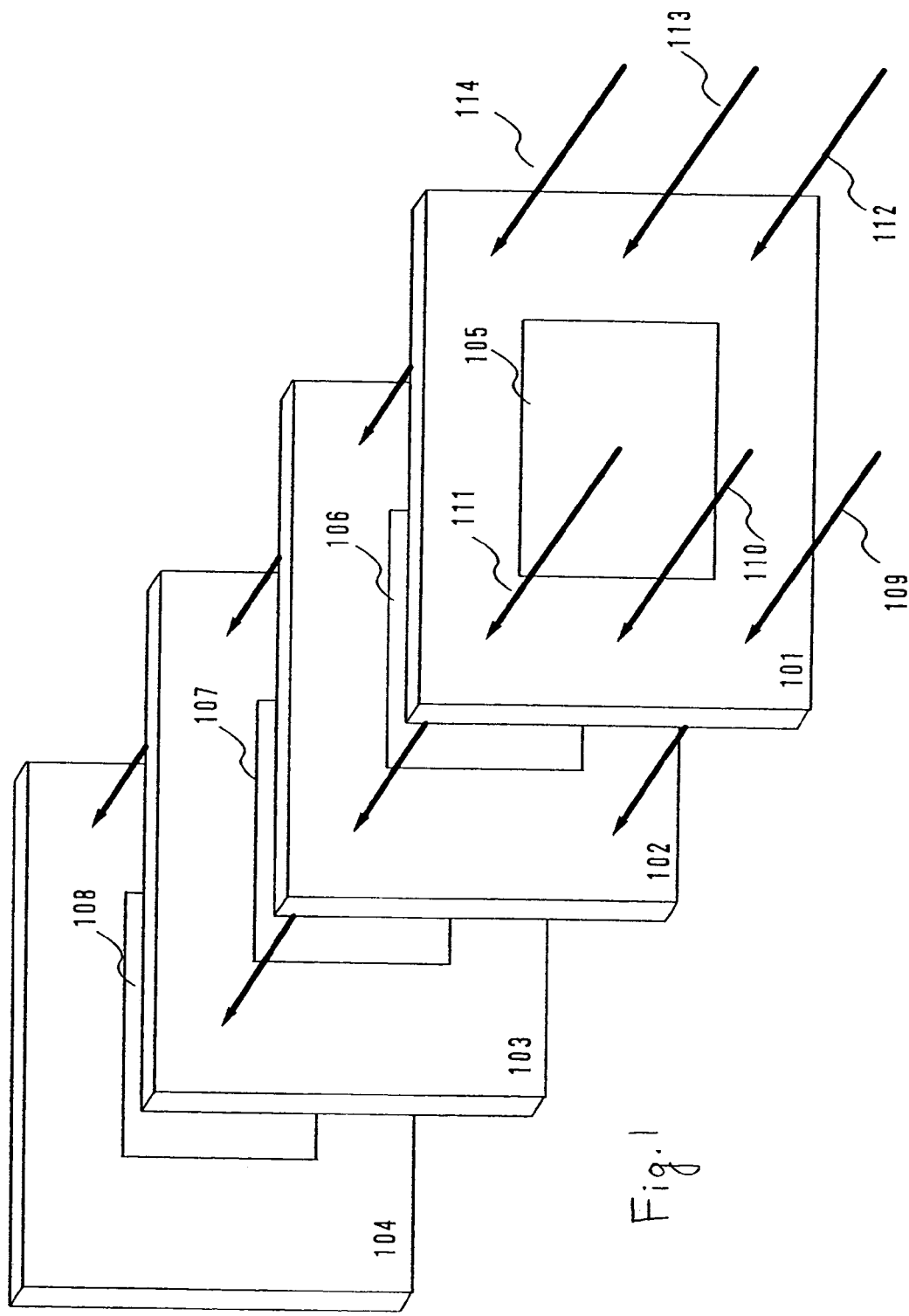
FIG. 1 is a diagram showing the configuration of an electronic circuit device of the present invention.

FIG. 1 shows a configuration of the present invention. In the present invention, an electronic circuit is formed on a transparent substrate such as a glass substrate, a quartz substrate, a plastic substrate and the like. In FIG. 1, an electronic circuit device of the present invention is configured with four sheets of transparent substrates 101, 102, 103 and 104, but it is not limited to these, the number of substrates may be made more or less.

An optical signal is inputted from an external light source (not shown) into the transparent substrates 101-104. In FIG. 1, optical signals are shown as luminous fluxes 109-114. On the transparent substrates 101-104, electronic circuits 105-108 which have been configured with a thin film transistor and the like are formed. In FIG. 1, an electronic circuit is disposed at the center of the transparent substrate, however, an electronic circuit in the present invention is not limited to this, the electronic circuit may be disposed at any position on the substrate.

Moreover, any of optical signals of FIG. 1 has been inputted nearby the outer periphery of the transparent substrate, however, an electronic circuit device of the present invention is not limited to this, the position of the light input may be freely set at any position on the substrate.

Next, the input of a signal of the present invention will be described below. In the present invention, an input signal is inputted as an optical signal. In the present invention, an interface of input and output is configured with an input section, an output section, an interface within the device. Depending on a configuration, it may be configured with one or two sections out of these three.

Figure 2:
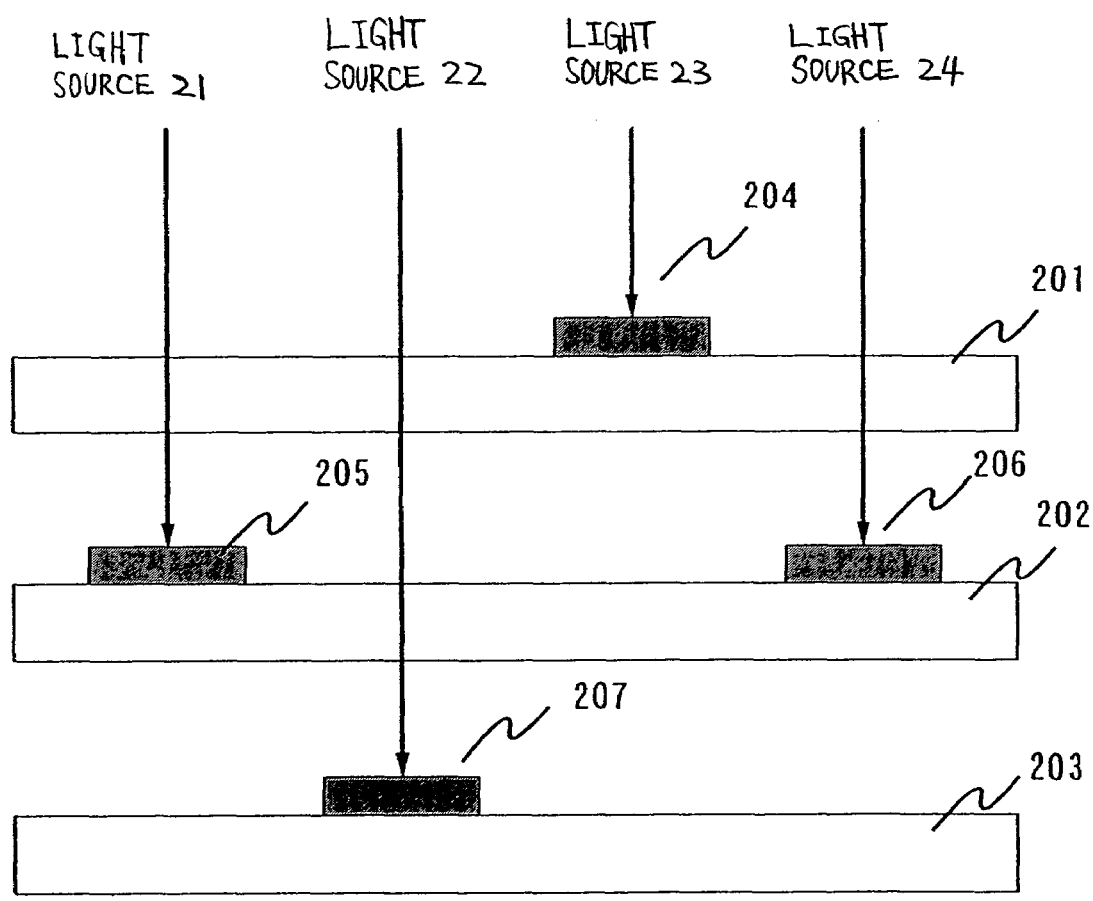
FIG. 2 is a diagram showing a signal input section of the present invention.

First, a light input section will be described below. FIG. 2 shows an input section and a cross sectional view of a transparent substrate. An optical signal is inputted from external light sources 21-24. First, the optical signal emitted from the light source 21 is transmitted through the transparent substrate 201, and irradiated on an optical sensor 205 which is disposed on the transparent substrate 202. The optical sensor 205 converts an optical signal into an electric signal, and outputs the electric signal which has been converted to an electric circuit disposed on the transparent substrate 202. An optical signal emitted from a light source 22 is transmitted through the transparent substrates 201, 202, and irradiated on an optical sensor 207 which is disposed on the transparent substrate 203. The optical sensor 207 converts an optical signal into an electric signal, and outputs the electric signal which has been converted to an electric circuit disposed on the transparent substrate 203.

The optical signal emitted from a light source 23 is irradiated on the optical sensor 204 which is disposed on the transparent substrate 201. The optical sensor 204 converts an optical signal into an electric signal, and outputs the electric signal which has been converted to an electronic circuit disposed on the transparent substrate 201. The optical signal emitted from a light source 24 is transmitted through the transparent substrate 201, and is irradiated on the optical sensor 206 which is disposed on the transparent substrate 202. The optical sensor 206 converts an optical signal into an electric signal, and outputs the electric signal which has been converted to an electric circuit which is disposed on the transparent substrate 202.

In this way, the optical signals inputted from the light sources 21-24 are converted into electric signals on the transparent substrates by the sensors 204-207. Since it is eliminated that an electric signal is redundantly decompressed as being the conventional example, problems such as noise and the like which have been conventionally problems are capable of being eliminated.

Figure 3:
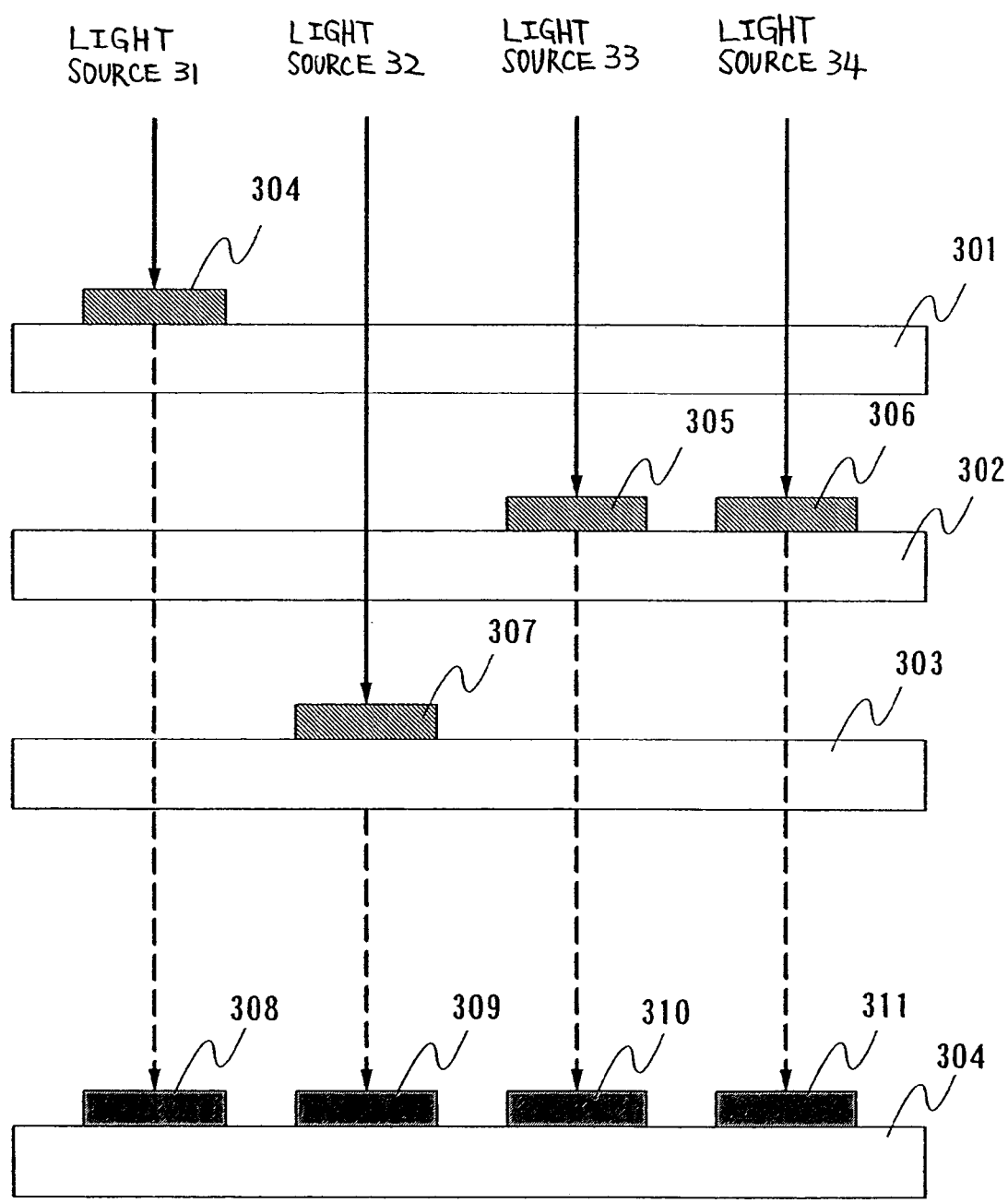
FIG. 3 is a diagram showing a signal output section of the present invention.

Next, the configuration of the output section is shown in FIG. 3. As FIG. 3 being similar to FIG. 2, cross sectional views of the respective transparent substrates are shown. The output section is a portion that functions to take out the outputs of the respective transparent substrates to the external works. As for an optical signal inputted from a light source 31, it is determined whether the optical signal is transmitted through or not by an optical shutter 304 disposed on the transparent substrate 301. The optical shutter 304 is controlled by a signal of the electric circuit disposed on the transparent substrate 301. If the optical shutter has not transmitted the optical signal, an optical signal of the light source 31 is not transmitted to the transparent substrate 301 and thereafter. Moreover, if the optical shutter has transmitted the optical signal, the optical signal of the light source 31 is transmitted through the transparent substrates 301, 302 and 303, and reaches to the optical sensor 308, where the optical signal is converted into an electric signal, and then outputted to the external.

Similarly, an optical signal emitted from a light source 32 is transmitted through the transparent substrates 301, 302, and is inputted into an optical shutter 307. Now, in the case where the optical shutter 307 is controlled by an electric circuit disposed on the transparent substrate 303, and it has been transmitted, it is transmitted through the transparent substrate 303, is inputted into the optical sensor 309, and is converted into an electric signal, and outputted. Moreover, optical signals emitted from the light sources 33, 34 pass through the transparent substrate 301, and are inputted into the optical shutters 305, 306. The optical shutters 305, 306 are controlled by an electric circuit disposed on the transparent substrate 302, and in the case where it has been determined that these are transmitted through the substrate, these optical signals are transmitted through the transparent substrates 302, 303, are converted into electric signals by the optical sensors 310, 311, and outputted. In this way, the output of the electronic circuit is capable of being taken out to the external.

Figure 4:
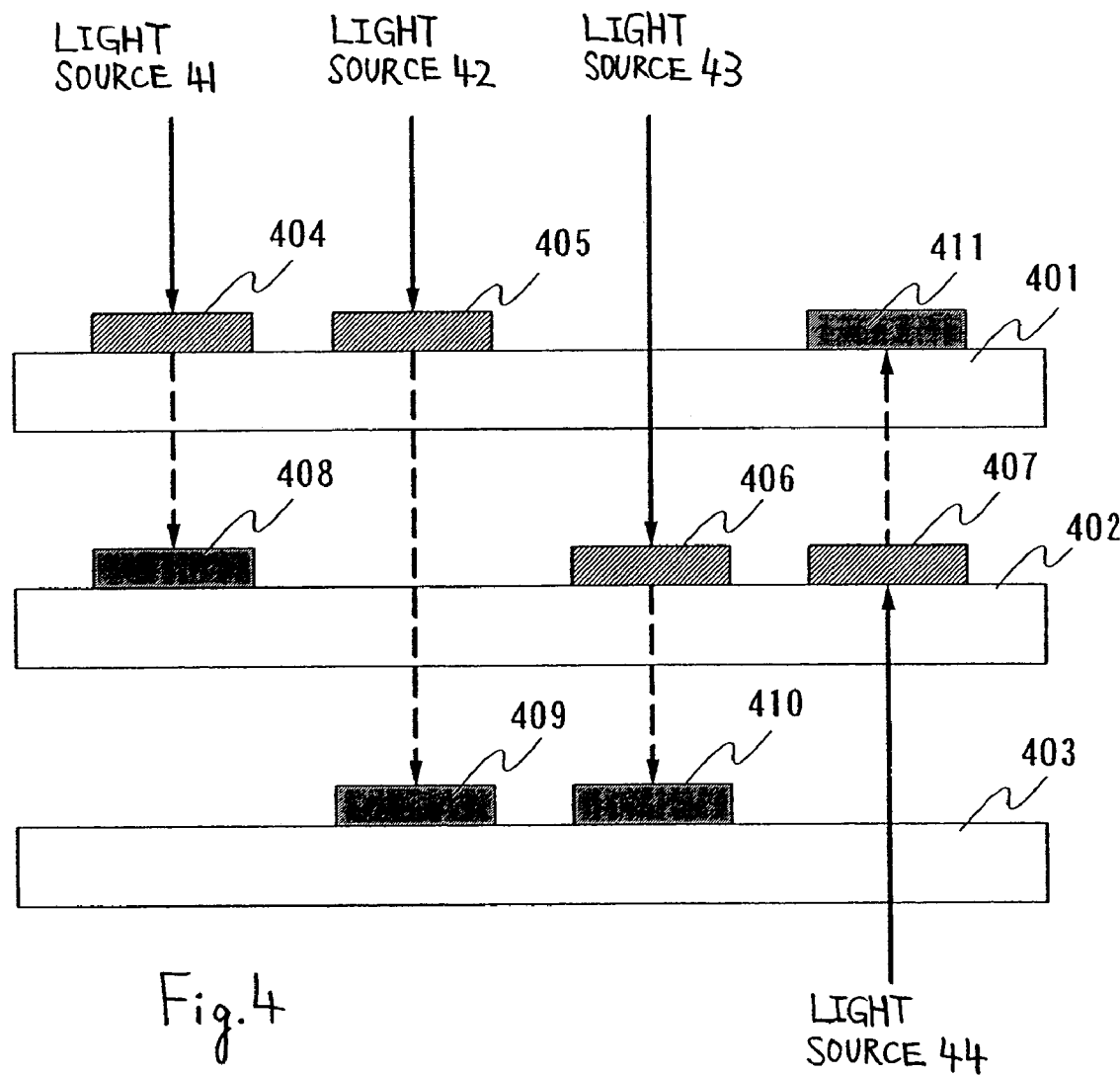
FIG. 4 is a diagram showing a signal connection section of the present invention.

Next, an interface of a signal between the transparent substrates will be described below. Although the explanation will be described with reference to FIG. 4, also here, cross sectional views of the respective transparent substrates are shown as being similar to FIG. 2 and FIG. 3. First, the case where a signal on the transparent substrate 401 is transmitted to a circuit disposed on the transparent substrate 402 will be described below. Whether an optical signal outputted from a light source 41 is transmitted or is not transmitted is controlled by the optical shutter 404 disposed on the transparent substrate 401, and the optical shutter 404 is controlled by an electric circuit disposed on the transparent substrate 401. In the case where it has been determined that the optical signal is transmitted, the optical signal emitted from the light source 41 is transmitted through the transparent substrate 401, is inputted into an optical sensor 408 disposed on the transparent substrate 402, converted into an electric signal and inputted into an electric circuit disposed on the transparent substrate 402. In this way, a signal of the transparent substrate 401 is capable of being transmitted to an electric circuit disposed on the transparent substrate 402.

Next, the case where a signal on the transparent substrate 401 is transmitted to a circuit disposed on the transparent substrate 403 will be described below. In the case where whether the light inputted from a light source 42 is transmitted or not transmitted is controlled by an optical shutter 405 disposed on the transparent substrate 401, and it has been determined that the light is transmitted through the substrate, it is transmitted through the transparent substrates 401, 402, and inputted into an optical sensor 409 disposed on the transparent substrate 403. The optical sensor 409 converts the optical signal into an electric signal, and inputs it into an electric circuit disposed on the transparent substrate 403.

Next, the case where a signal on the transparent substrate 402 is transmitted to a circuit disposed on the transparent substrate 403 will be described below. In the case where the light inputted from a light source 43 is transmitted through the transparent substrate 401, whether the light inputted from the light source 43 is transmitted or not transmitted is controlled by an optical shutter 406 disposed on the transparent substrate 402, and it has been determined that the light is transmitted through the substrate, it is transmitted through the transparent substrates 402, and inputted into an optical sensor 410 disposed on the transparent substrate 403. The optical sensor 410 converts the optical signal into an electric signal, and inputs it into an electric circuit disposed on the transparent substrate 403.

Next, the case where a signal on the transparent substrate 402 is transmitted to a circuit disposed on the transparent substrate 401 will be described below. In the case where the light inputted from the light source 44 is transmitted through the transparent substrate 403, whether the light inputted from the light source 44 is transmitted or not transmitted is controlled by an optical shutter 407 disposed on the transparent substrate 402, and it has been determined that the light is transmitted through the substrate, it is transmitted through the transparent substrates 401, and inputted into an optical sensor 411 disposed on the transparent substrate 401. The optical sensor 411 converts the optical signal into an electric signal, and inputs it into an electric circuit disposed on the transparent substrate 401.

As described above, in the present invention, an electric wiring between substrates is not used, but an optical signal is used, thereby realizing the exchange of data between substrates. Owing to this, the problems such as noises caused by unnecessary electromagnetic waves as described above and the like can be solved.

Figure 5:
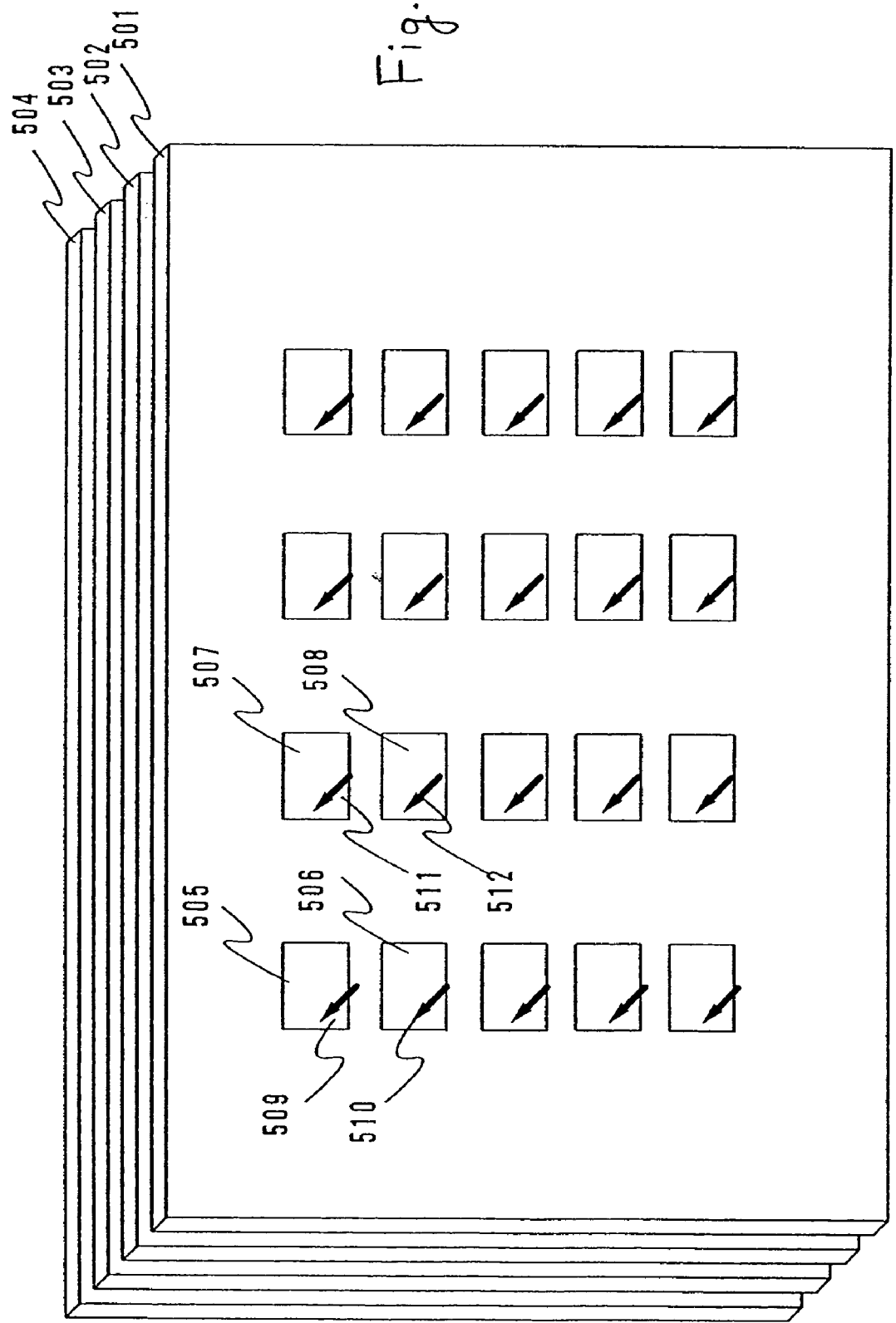
FIG. 5 is a diagram showing Example of a transparent substrate of the present invention.

What is shown in FIG. 5 is Embodiment in which a plurality of optical paths of the present invention are disposed not on the periphery of the substrate, but on almost all of the substrate including the area nearby the center. In this way, in the present invention, it is not made so that a signal is taken out using a wiring from the end portions of the substrate as the conventional print substrates, but the input and output of a signal is capable of being carried out from any point on the substrate only if the light is transmitted. Hence, the limitations of the number of wirings become less comparing to those of the conventional print substrate, and many signals are capable of being processed in parallel.

Moreover, if the number of signals which are processed in parallel is increased, by that portion, the frequency of the signals is capable of being lowered. For example, in the case where 100 millions of data information units are transmitted per second, if the number of the transmission paths is 10, 10 millions of data information units must be transmitted through one transmission path, therefore, it is necessary to make the frequency 10 MHz, but if the number of the transmission paths is 1000, since only 100 thousands of data information units are transmitted through one path, the frequency can be lowered to the level of 100 KHz.

In this way, the frequency is capable of being lowered since many parallel processes are capable of being carried out, and the electromagnetic noises which have been a problem of the conventional techniques are capable of further being reduced. Moreover, FIG. 5 shows Embodiment in the case where a computer is manufactured by utilizing the present invention, and it is configured with arithmetic circuit substrate 501, memory substrates 502, 503 and 504. The exchange performed between the arithmetic circuit and the memory circuit can be simplified by carrying out the parallel processes using an optical signal. 505, 506, 507 and 508 are arithmetic circuits which function as light interfaces, which receive an optical signal and convert it into an electric signal. 509, 510, 511 and 512 are beams inputted via the light interface.

EXAMPLES

Hereinafter, Examples of the present invention will be described.

Example 1

Figure 7:
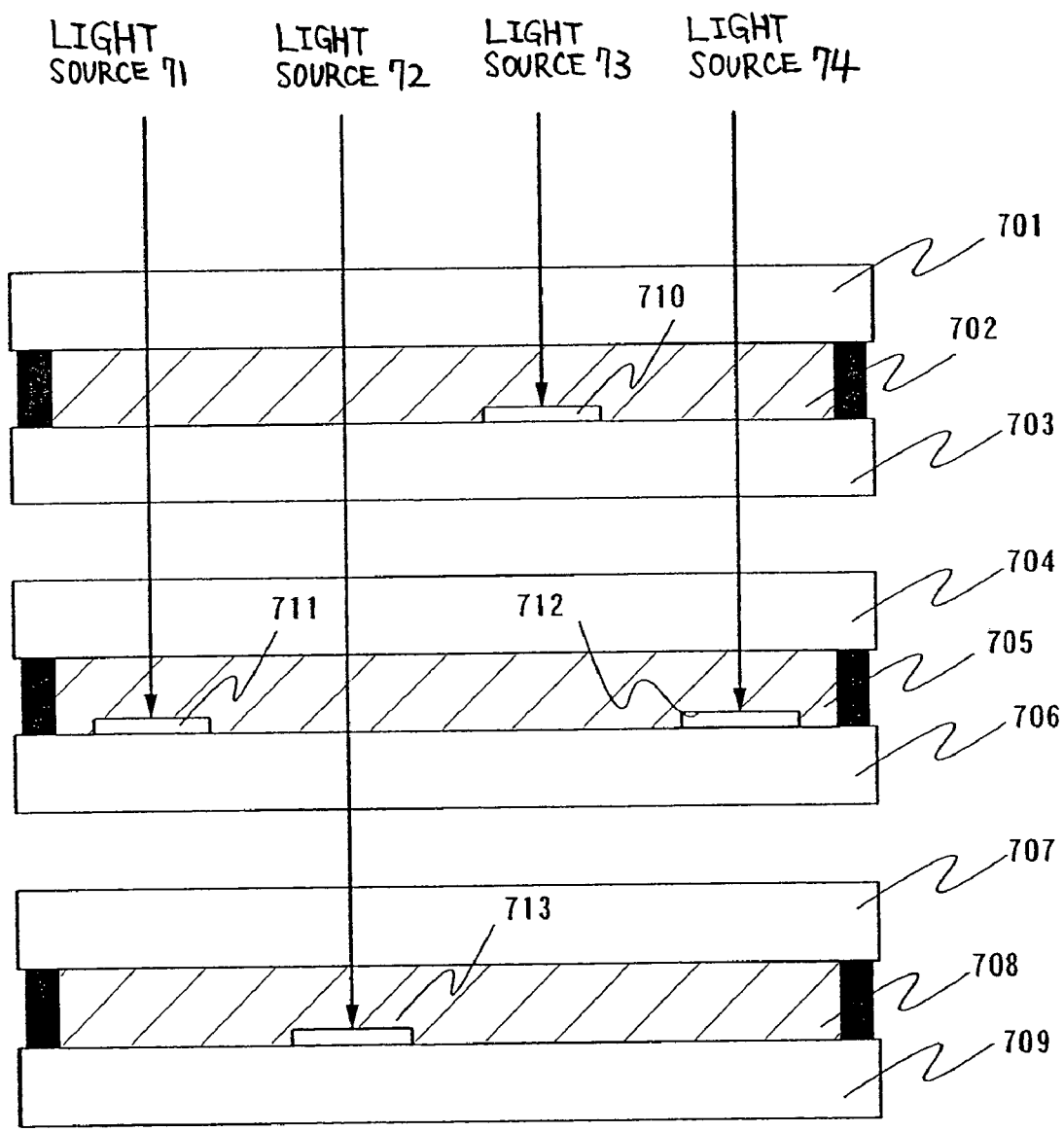
FIG. 7 is a diagram showing a signal input section of the present invention.

First, the light input section of the present invention will be described below with reference to FIG. 7. FIG. 7 has been further embodied from FIG. 2. In the present Example, two sheets of transparent substrates configuring a circuit substrate are used as a unit. This is because the optical shutter described later is composed of a liquid crystal. As the ordinary skilled person in the art knows well, the liquid crystal panel is fabricated by injecting a crystal liquid material into the cell gap in width of several μm, the transmittance of the light is controlled by the applied voltage and the liquid crystal functions as an optical shutter. The light input section shown in FIG. 7 does not need the function of a crystal liquid, however, since the fabrication of the substrate becomes easier if a crystal liquid is injected on the entire surface of the substrate, in the present Example, a crystal liquid has been injected. Although the fabrication becomes complex, a configuration in which the liquid crystal is eliminated from the light input section is also capable of being employed. In such a case, only the position where the optical shutter exists is surrounded with a sealing material, and the liquid crystal may be injected into only that portion.

The light emitted from a light source 71 reaches to an optical sensor 711 after the light has been transmitted through a transparent substrate 701, a liquid crystal 702, transparent substrates 703, 704, and a liquid crystal 705. The light emitted from a light source 72 reaches to an optical sensor 713 after the light has been transmitted through the transparent substrate 701, the liquid crystal 702, the transparent substrates 703, 704, the liquid crystal 705, transparent substrates 706, 707, and a liquid crystal 708. The light emitted from a light source 73 reaches to an optical sensor 710 after the light has been transmitted through the transparent substrate 701, and the liquid crystal 702. Similarly, the light emitted from a light source 74 reaches to an optical sensor 712 after the light has been transmitted through the transparent substrate 701, the liquid crystal 702, the transparent substrates 703, 704, and the liquid crystal 705.

Example 2

Figure 11:
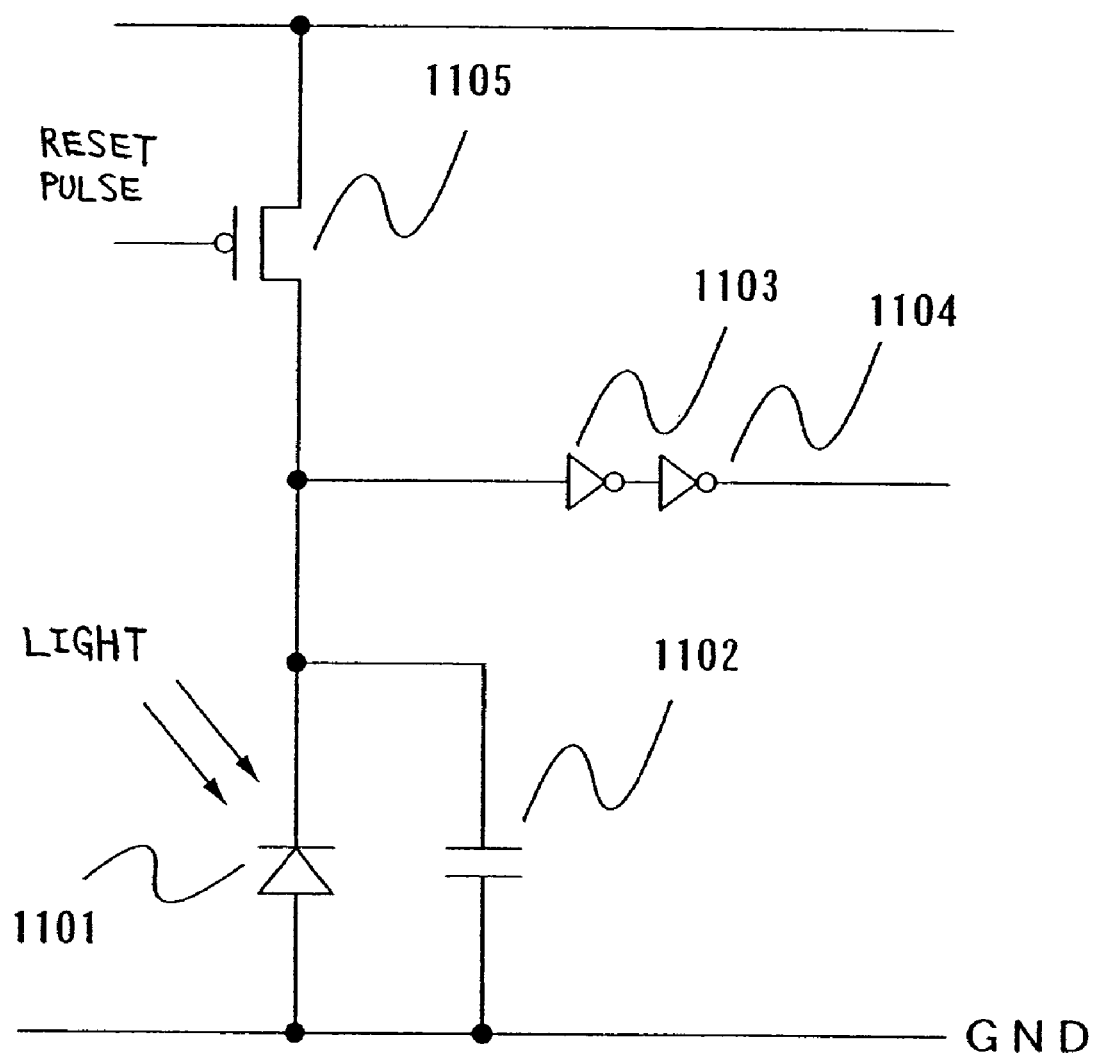
FIG. 11 is a diagram showing a circuit of an optical sensor of the present invention.

The portion of an optical sensor depicted in FIG. 7 will be described in detail below. In FIG. 11, a diagram depicting a circuit of the optical sensor portion according to the present invention is shown. In the present invention, an optical sensor is configured with a photodiode. This operation will be described below with reference to FIG. 11. First, a reset pulse is inputted into a reset transistor 1105. Herein, since a TFT (Thin Film Transistor) of Pch (P-channel polarity) is used for this reset transistor, the signal is active-low. When this reset transistor 1105 is turned ON, the cathode potential of a photodiode 1101 is raised to the level of potential of the electric source. At this time, a holding capacitance 1102 is also similarly raised to the level of potential of the electric source. This holding capacitance 1102 may not be particularly mounted if the capacitance of the photodiode 1101 is large. Next, the reset pulse becomes high, and the reset transistor 1105 is turned OFF.

In the case where the light is not inputted, if the amount of leakage of the reset transistor 1105 and the inverter for buffer 1103 is sufficiently small, the cathode potential of the photodiode 1101 is held as it is.

Figure 6:
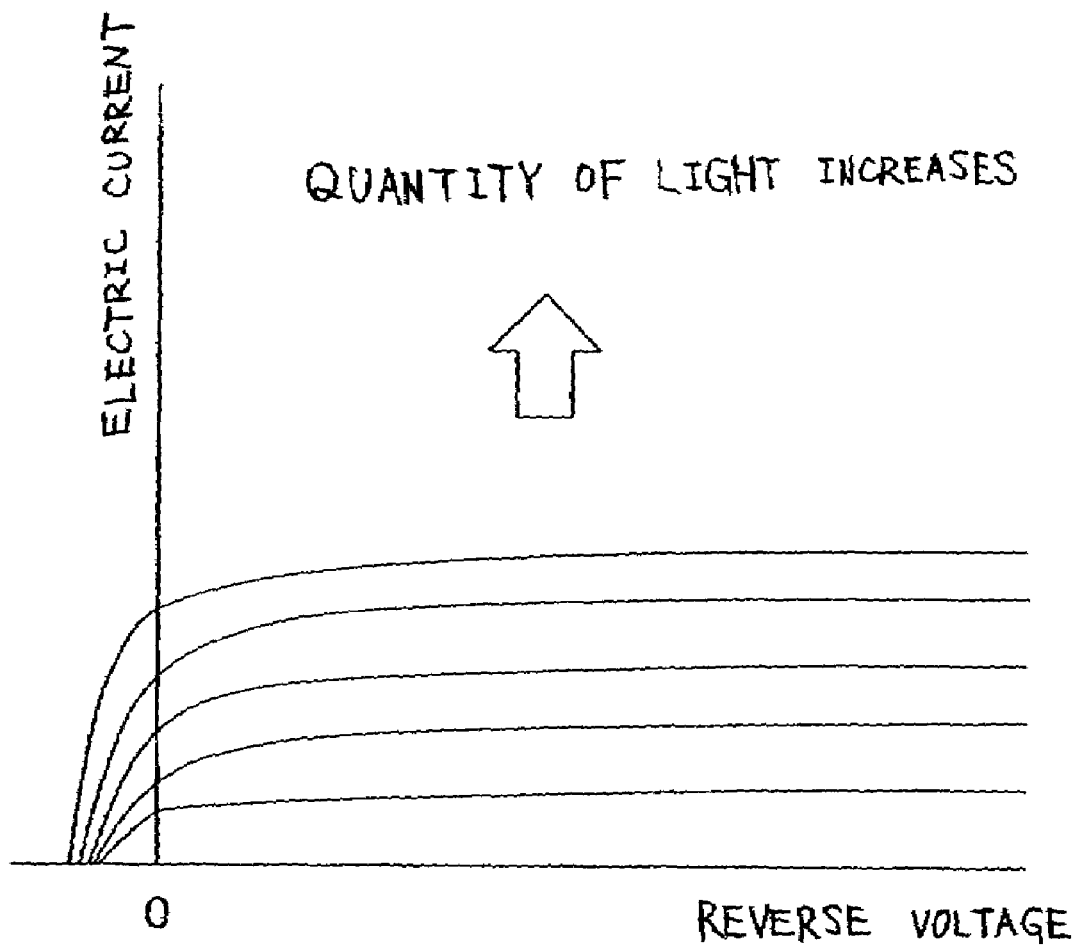
FIG. 6 is a graphical representation showing a voltage-current characteristic of a photodiode characteristic of an optical sensor of the present invention.

Next, when the light is inputted, a current flows through the photodiode 1101, and the charge of the holding capacitance is drawn to the GND (ground). In this way, the output potential of the photodiode 1101 is going to be lowered when the light is inputted, and is outputted via inverters 1103, 1104 which lead to the output of the photodiode 1101. In FIG. 6, a schematic diagram of the photodiode characteristic is shown. When the reverse bias has been applied to the photodiode 1101, approximately constant current flows regardless of voltage, and the current is controlled by the amount of light irradiated. It should be noted that a photodiode of the present Embodiment of the present invention is not limited to a photodiode, a photo detector using the other methods might be employed. Specifically, an optical sensor may be made of amorphous silicon, polysilicon (p-Si), single crystal silicon, or the other semiconductor materials. Moreover, as for an element structure, not only photodiode but also phototransistor may be used.

Figure 12:
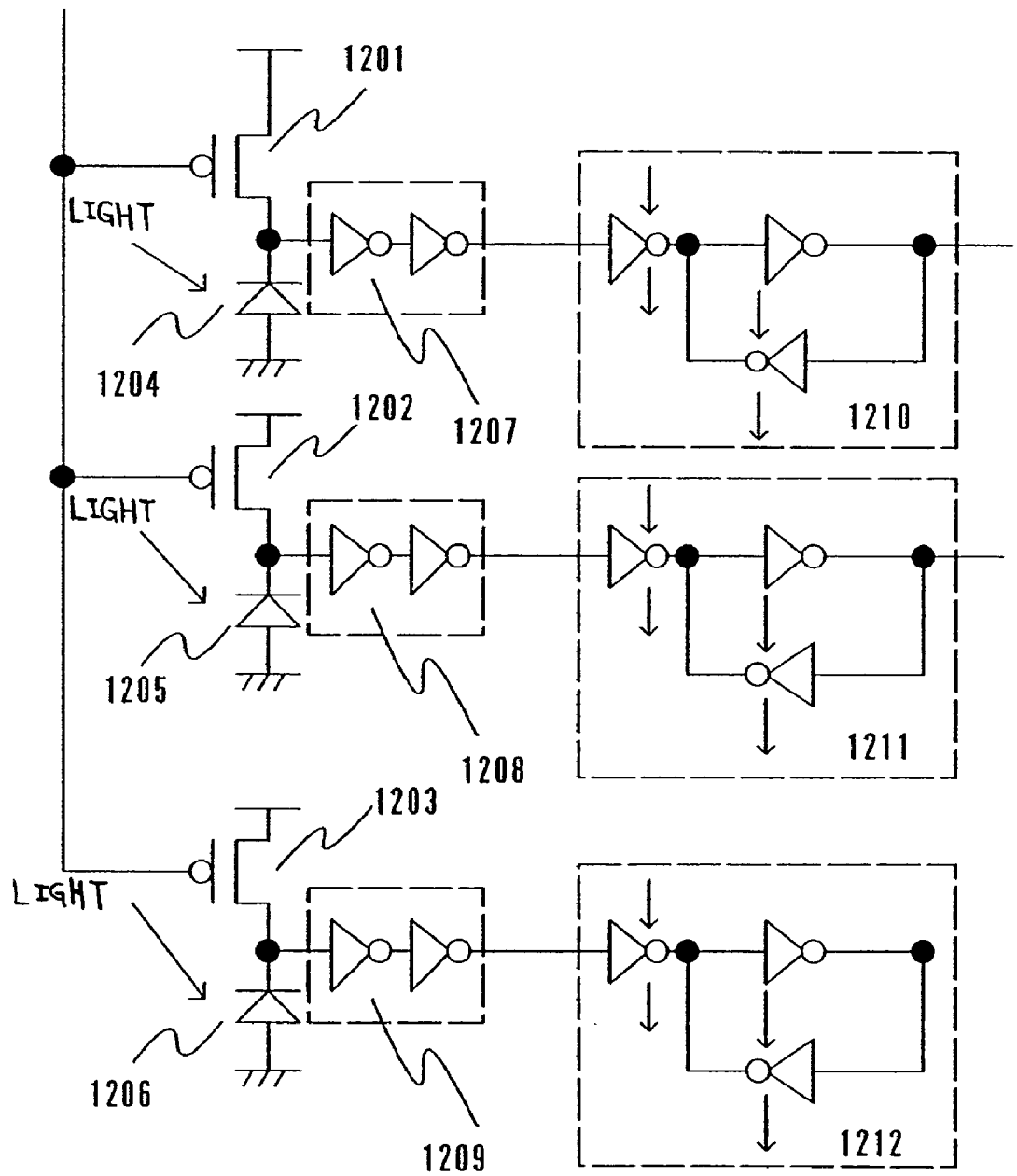
FIG. 12 is a diagram showing a circuit of an optical sensor and a DFF (Delayed Flip Flop) of the present invention.
Figure 15:
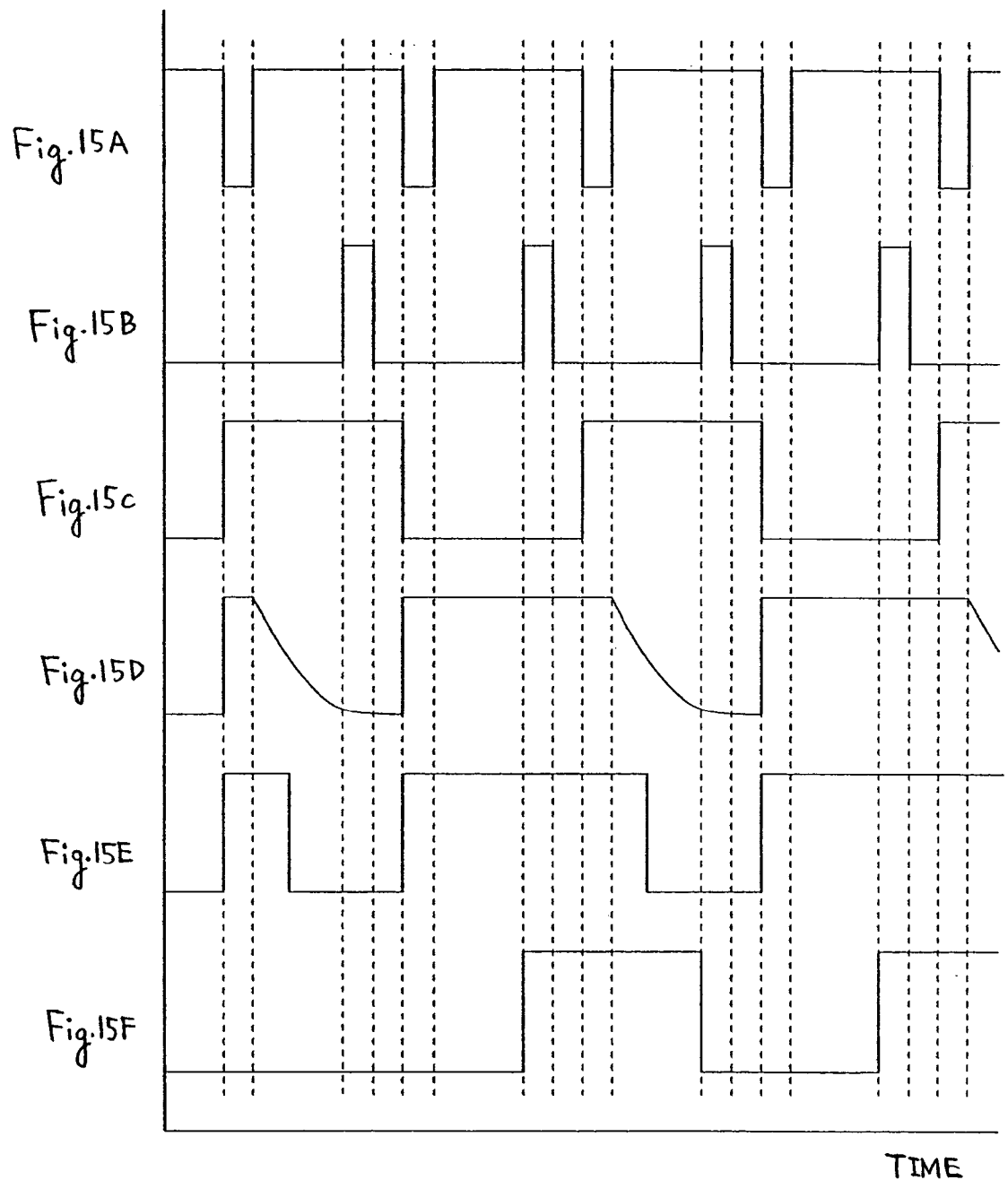
FIG. 15 is a diagram showing a timing chart of an optical sensor and a DFF (Delayed Flip Flop) of the present invention.

Moreover, in FIG. 12, Example of a circuit in which a plurality of photodiodes are used, its data is taken using a latch pulse and memorized is shown. FIG. 12 shows Example in which a plurality of circuits shown in FIG. 11 are disposed, DFFs (Delayed Flip Flops) 1210, 1211 and 1212 were connected after reset transistors 1201, 1202 and 1203, photodiodes 1204,1205 1206, and buffer circuits 1207, 1208 and 1209. FIG. 15 shows a timing of the circuit shown in FIG. 12. Hereinafter, an operation will be described with reference to FIG. 15.

FIG. 15A represents a reset pulse for the purpose of driving a reset transistor 1201, and as described above, in the case where the Pch TFT (Thin Film Transistor having P-channel polarity) is employed for the reset transistor 1201, it becomes active-low. When the reset transistor 1201 is turned ON, the cathode potential of the photodiode 1204 is raised up to the level of potential of the electric source. When the reset pulse becomes high, and the reset transistor 1201 is turned OFF, the behavior after that is changed depending upon whether the light irradiation has been carried out or not. FIG. 15C represents the existence of the light irradiation or non-existence of the light irradiation, in the case where the reset is high, it represents that the light irradiation has been carried out, and in the case where the reset pulse is low, it represents that the light irradiation has not been carried out. FIG. 15D represents a cathode potential of the photodiode 1204, and in the case where the light irradiation has been carried out, the voltage is going to be lowered as the reset transistor 1201 is turned OFF.

FIG. 15E represents a reset pulse that the output of the photodiode 1204 has been transmitted through the buffer circuit 1207 of the inverter, and the cathode potential of the photodiode 1204 is turned in reverse around the intermediate point between the electric source and the GND (ground=0), and the output of the buffer circuit 1207 is going to be changed from a high potential to a low potential. On the other hand, in the case where the light irradiation has not been performed, since the photodiode 1204 does not electrically discharge, when the reset transistor 1201 is turned OFF, the cathode potential of the photodiode 1204 is held as it is, and the output of the buffer circuit 1207 remains as it is. FIG. 15B represents a latch pulse, when the latch pulse is high, the DFF 1210 takes the output of the buffer circuit 1207 into it, and holds it until the latch pulse is inputted subsequently. In this way, the irradiated optical signal is converted into an electric signal.

Example 3

Figure 13:
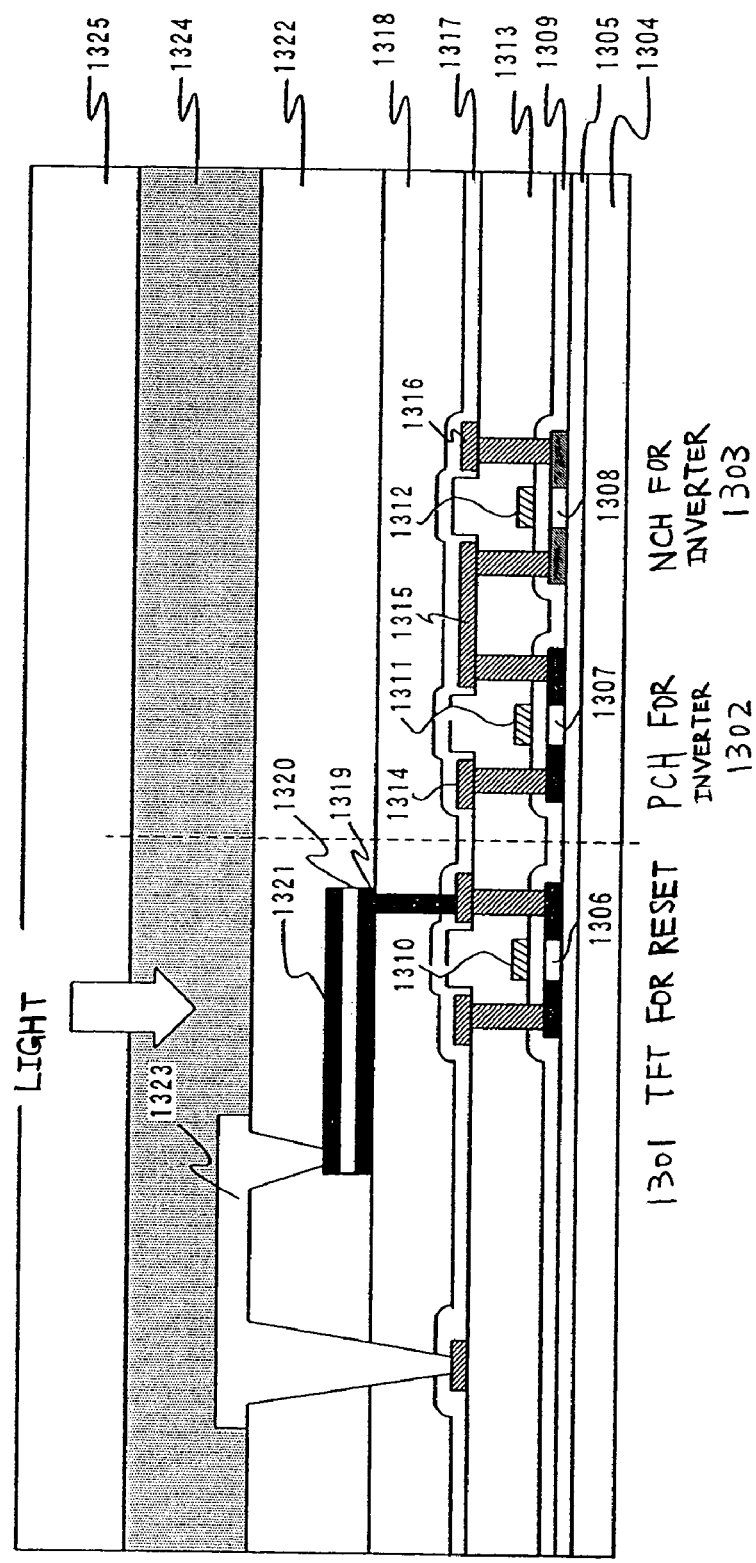
FIG. 13 is a cross sectional view of an optical sensor of the present invention.

FIG. 13 shows a cross sectional view of a photodiode formed on the transparent substrate. In FIG. 13, an optical sensor that has been configured with photodiodes of amorphous silicon and a TFT (Thin Film Transistor) is shown. Hereinafter, FIG. 13 will be described. In the present Example, a TFT (Thin Film Transistor) and a photodiode are formed by the following method: first, an over coat film 1305 is formed on a glass substrate 1304. As for this film, an oxide film or a nitride film is formed by a CVD (Chemical Vapor Deposition) method. Next, amorphous silicon is formed into a film in a similar manner by the CVD (Chemical Vapor Deposition) method. An amorphous silicon film is crystallized by a laser annealing method, or by a thermal annealing method. In this way, a polysilicon (p-Si) film can be formed. Next, islands 1306, 1307 and 1308 are formed by patterning the film made of polysilicon (p-Si). Then, a gate insulating film 1309 is formed by a CVD (Chemical Vapor Deposition) method.

Then, as a metal which is to be a gate electrode, that is, as a metal for gate electrode which is formed into a film by a sputtering method, Al (Aluminum), Ta (Tantalum), W (Tungsten) and the like are used. After gate electrodes 1310, 1311 and 1312 have been formed by patterning, an impurity for a source and a drain is doped using a mask by means of photoresist. After an impurity for Nch (N-channel polarity) has been doped into an Island 1308, and an impurity for Pch (P-channel polarity) has been doped into Islands 1306, 1307, the activation of the impurities is performed by a laser annealing method or by a thermal annealing method. Subsequently, a first inter layer film 1313 is formed and the opening of a contact hole is performed.

Furthermore, a metal film for a source and a drain is formed and patterned, thereby forming electrodes 1314, 1315 and 1316 of sources and drains. The metal film is configured with a laminated film of a barrier metal and aluminum. By the procedure described above, a TFT (Thin Film Transistor) for reset 1301, TFTs (Thin Film Transistors) for inverter 1302, 1303 are formed. Next, as a second inter layer film, a nitride film 1317 and a resin film 1318 are formed, and a contact hole is opened. Then, a cathode electrode of photodiode 1319 is formed. Subsequently, an amorphous film is formed and patterned, thereby forming a photodiode 1320. Next, an anode electrode 1321 is formed. Furthermore, a third inter layer film 1322 is formed and a contact hole is opened. Next, ITO (Indium Tin Oxide) is formed into a film and patterned, thereby forming a wiring 1323 for connecting the anode of the photodiode and the circuit of the TFT (Thin Film Transistor). This ITO (Indium Tin Oxide) is to be a liquid crystal electrode in an optical shutter described later. By the steps described above, a circuit of an optical sensor is completed.

Example 4

Figure 8:
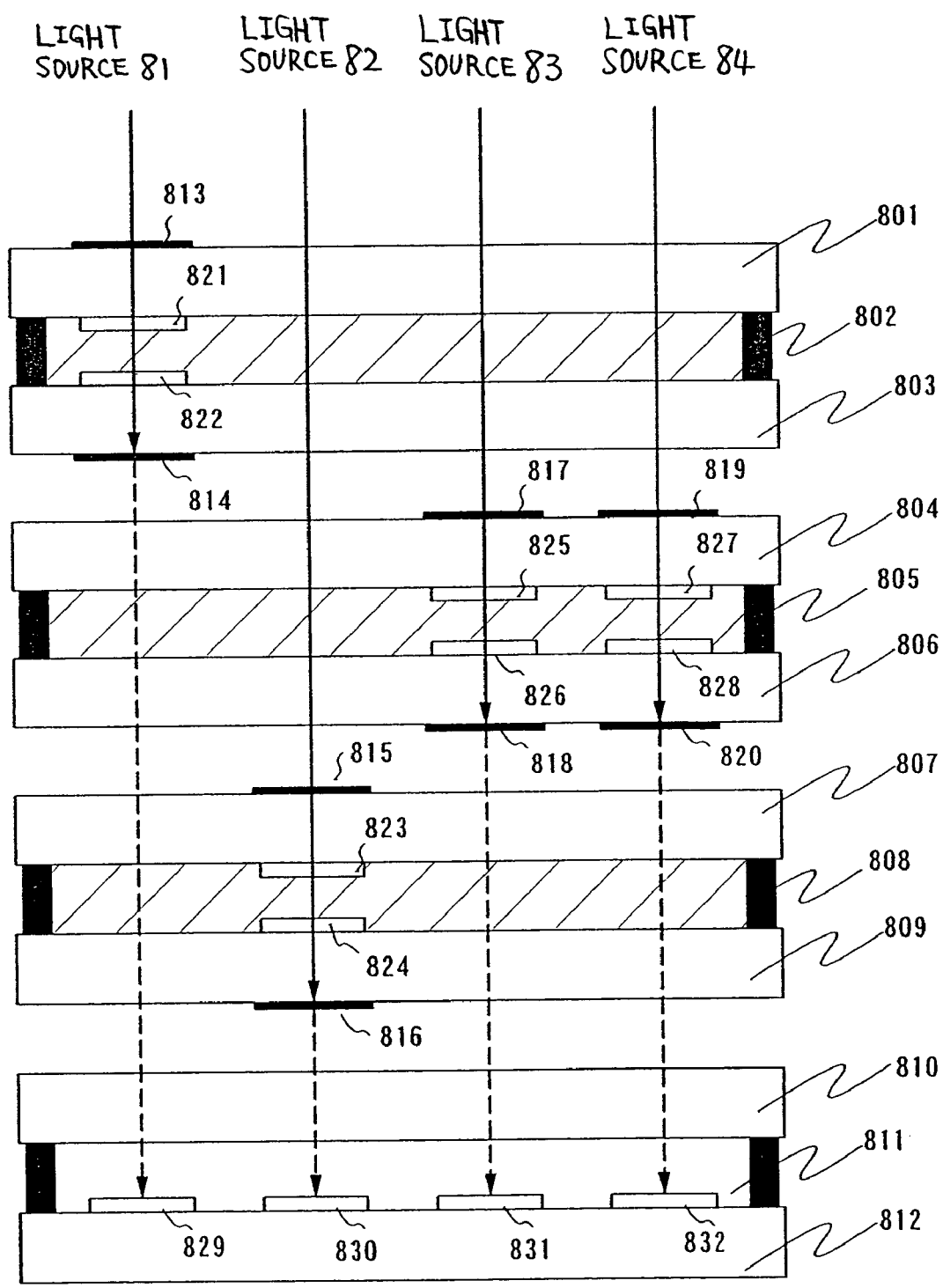
FIG. 8 is a diagram showing a signal input section of the present invention.

Next, an example in which Example shown in FIG. 3 has been further embodied is shown in FIG. 8. The light emitted from a light source 81 is inputted into an optical shutter configured with deflection plates 813, 814, a liquid crystal 802, and electrodes 821, 822. Now, if a circuit made by means of a TFT (Thin Film Transistor) has been formed on a transparent substrate 803, an electrode 821 is made fixed potential, the potential of an electrode 822 is controlled by the circuit disposed on the substrate 803, an electric field involving in the liquid crystal on the electrode is controlled, thereby capable of determining whether the light emitted from the light source 81 is transmitted through or interrupted. In the case where the light has been transmitted through it, the light is transmitted through the transparent substrates 804, 806, 807, 809 and 810, reaches to the optical sensor 829, where an optical signal is converted into an electric signal. Here, an optical sensor may be the configuration described above. Moreover, a liquid crystal is not necessary to be inputted into a pair of substrates configured with transparent substrates 810, 812 on which an optical sensor is provided. In this way, a signal of the circuit configured on the transparent substrate 803 is capable of being transmitted to the circuit configured on the transparent substrate 812 via the light emitted from the light source 81.

Next, the light emitted from a light source 82 is transmitted through the transparent substrates 801, 803, 804 and 806, and inputted into an optical shutter which has been configured with deflection plates 815, 816, electrodes 823, 824 and a liquid crystal 808. The fixed potential is applied to the electrode 823, the potential of the electrode 824 is controlled by a circuit formed on the substrate 809, thereby controlling the transmission or interruption of the light emitted from the light source 82. In the case where the light has been transmitted through it, it is transmitted through the transparent substrate 810, inputted into an optical sensor 830 and converted into an electric signal.

Next, the optical signal emitted from a light source 83 is transmitted through the transparent substrates 801, 803, and inputted into an optical shutter consisting of the deflection plates 817, 818, and electrodes 825, 826 and the liquid crystal 805. The fixed potential is applied to the electrode 825, the potential of the electrode 826 is controlled by a circuit formed on the transparent substrate 806, and the transmission and interruption of the optical shutter are controlled. The light which has been transmitted through the optical shutter is transmitted through the transparent substrates 807, 809 and 810, inputted into the optical sensor 831 and converted into an electric signal. The optical signal inputted into a light source 84 is also similarly converted into an electric signal in the optical sensor 832. In this way, the output of the respective transparent substrates is capable of being collected on the substrate 812 via the light.

Example 5

Figure 16:
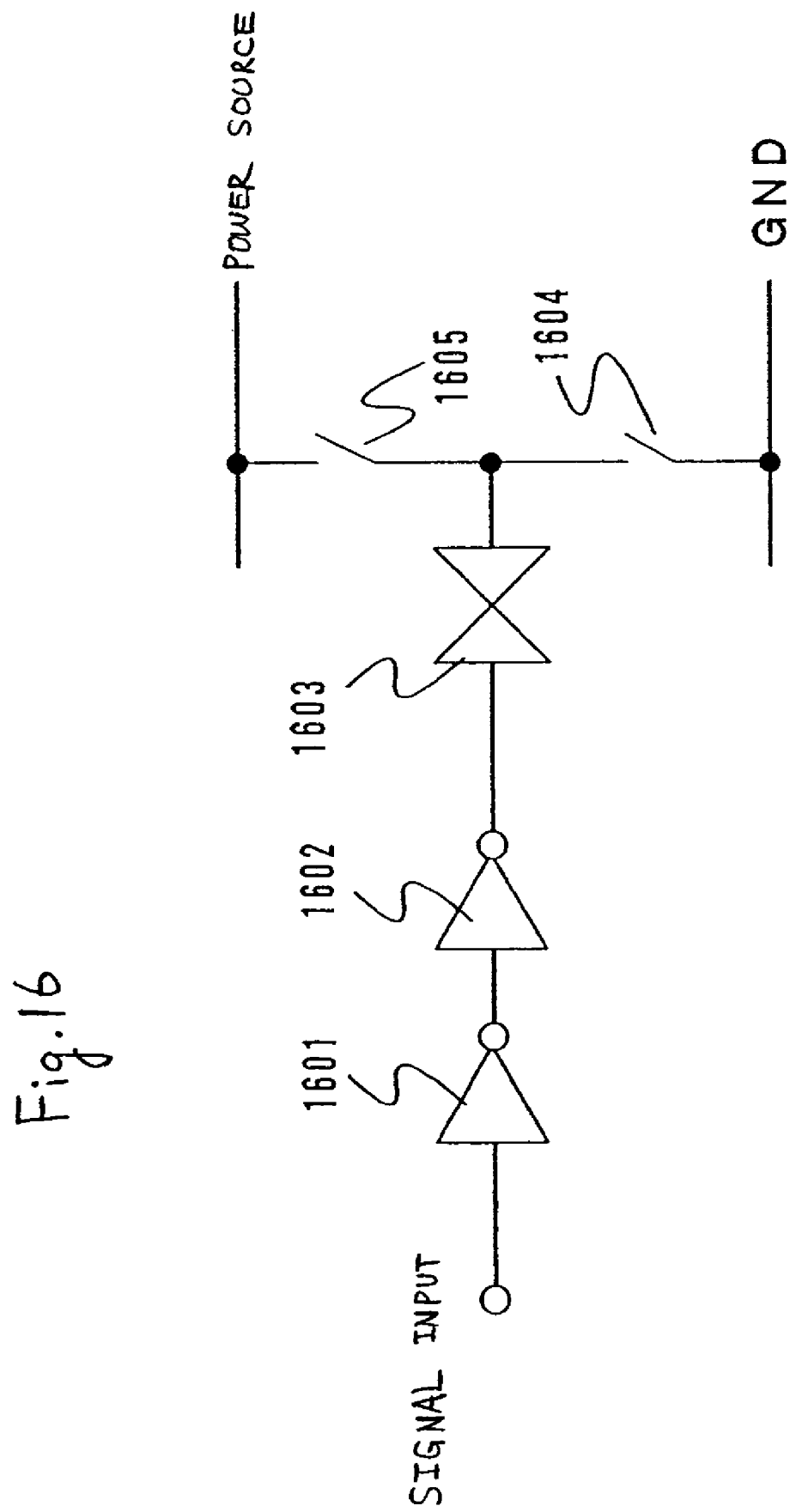
FIG. 16 is a diagram showing a circuit of an optical shutter of the present invention.

In FIG. 16, a circuit diagram of a portion that is to be an optical shutter is shown. Since it is not necessary to use the intermediate voltage as the active drive of TN liquid crystal which represents a half tone using the intermediate section in the characteristic of transmittance versus applied voltage, the voltage for applying to the liquid crystal may be binary. Hence, a liquid crystal material which is endurable for a high rate operation such as FLC (Ferroelectric Liquid Crystal) and the like which are endurable for higher rate operation than a TN liquid crystal is capable of being used. Needless to say, in the case where a higher response rate is not required, a TN liquid crystal and the like may be employed.

In FIG. 16, a liquid crystal element 1603 is driven via buffer circuits 1601, 1602 of the inverter using a control signal which opens and closes the optical shutter. When a switch 1604 is turned ON, and a switch 1605 is turned OFF, the control signal is at a high value, and when a material which is normally white colored is used for a liquid crystal, the liquid crystal optical shutter interrupts the light. When the control signal is at the low value, since the applied voltage to the liquid crystal is 0 V, the optical shutter transmits the light.

Since liquid crystal elements deteriorate if the specific voltage is applied for a long time, the voltage applied to the liquid crystal is turned in reverse by means of switches 1604, 1605. In this case, since the display is not seen by human beings as the usual liquid crystal display device, it is not necessary to turn in reverse at a frequency equal to or more than 60 Hz as the flicker countermeasures. It may be lower frequency. Moreover, if it is a liquid crystal material which tends to be less deteriorated even if the specific voltage is applied, it is also possible to stop turning in reverse. Moreover, in the case where the turning in reverse drive of the liquid crystal is performed, it is also necessary to turn a control signal in reverse along with the reverse signal.

Figure 14:
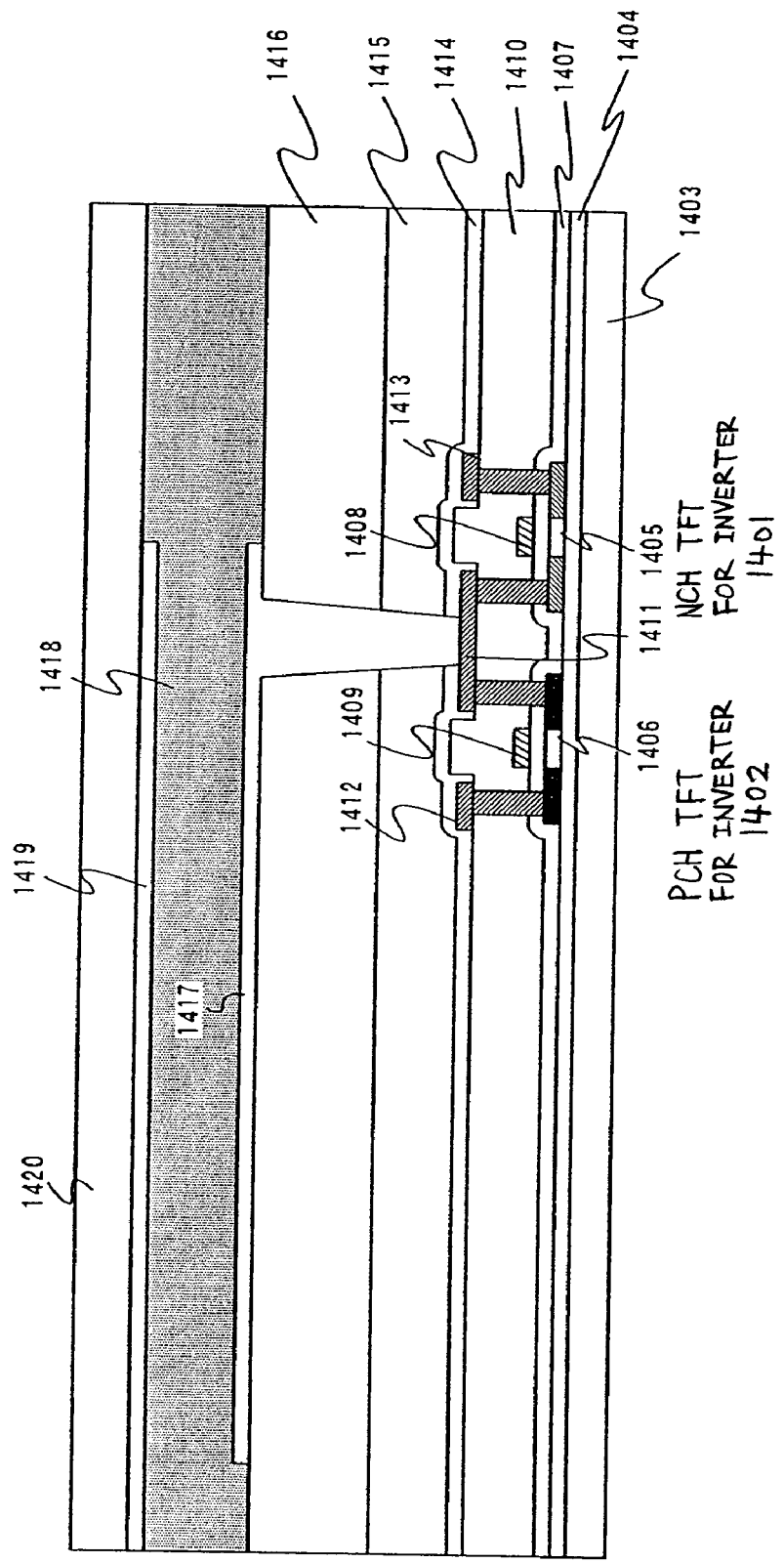
FIG. 14 is a cross sectional view of an optical shutter of the present invention.
Figure 17:
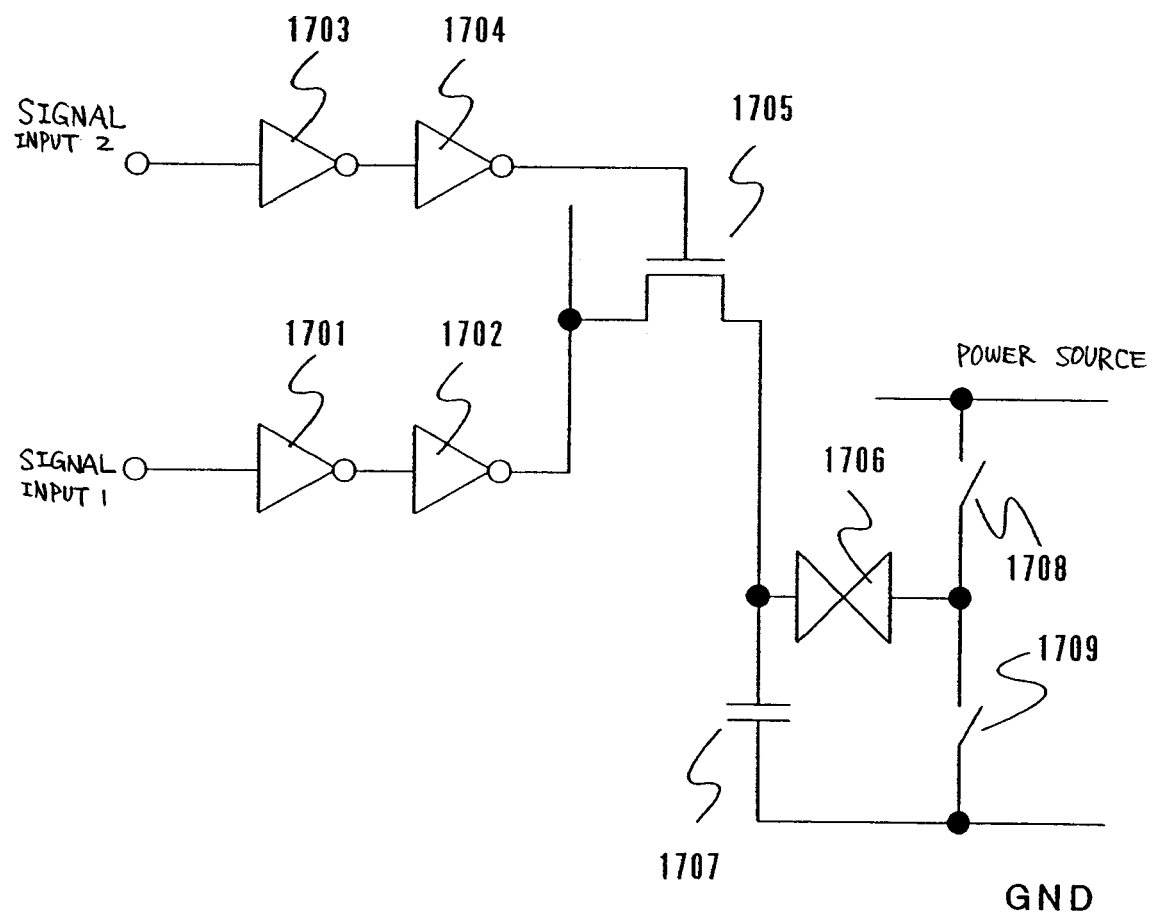
FIG. 17 is a diagram showing a circuit of an optical shutter of the present invention.

In FIG. 17, an example in the case where a DRAM type drive is performed using a switch transistor and capacitance so that it may be used in an active matrix type liquid crystal display device is shown. A control signal for opening and closing the optical shutter is inputted from the control signal input 1. Moreover, a write signal for writing a control signal into a liquid crystal element 1706 and a holding capacitance 1707 is inputted from control signal input 2. When the high value is inputted into control signal input 2, a write transistor 1705 is turned ON, the potential of a liquid crystal 1706 is connected to a buffer circuit 1702 of the control signal 1, and the output potential of the buffer circuit 1702 is written into the liquid crystal 1706 and the holding capacitance 1707. In this example, it is necessary to refresh by turning ON the write transistor 1705 periodically similarly to the DRAM. Switches 1708, 1709 have a function for the purpose of preventing the liquid crystal material from being deteriorated similarly to FIG. 16. In FIG. 14, a cross sectional view of an optical shutter is shown. Although the configurations of the respective layers are approximately the same with the cross sectional view of the optical sensor, the fact that a layer of photodiode does not exist makes it different from the optical sensor portion. Drains of a Pch TTF (Thin Film Transistor having P-channel polarity) 1402 and a Nch TFT (Thin Film Transistor having N-channel polarity) 1401 which configure the inverter is connected to a shutter electrode 1417, and are driven by the TFT 1402 and the TFT 1401. Although the shutter electrode 1417 is formed with ITO (Indium Tin Oxide), if it is a transparent electrode, the material is not limited to ITO. A liquid crystal 1418 is driven by a voltage between a counter electrode 1419 and a shutter electrode 1417, and as described above, it is desirable that the counter electrode 1419 is turned in reverse with an alternating current in order to secure the reliability of the liquid crystal.

Example 6

Figure 9:
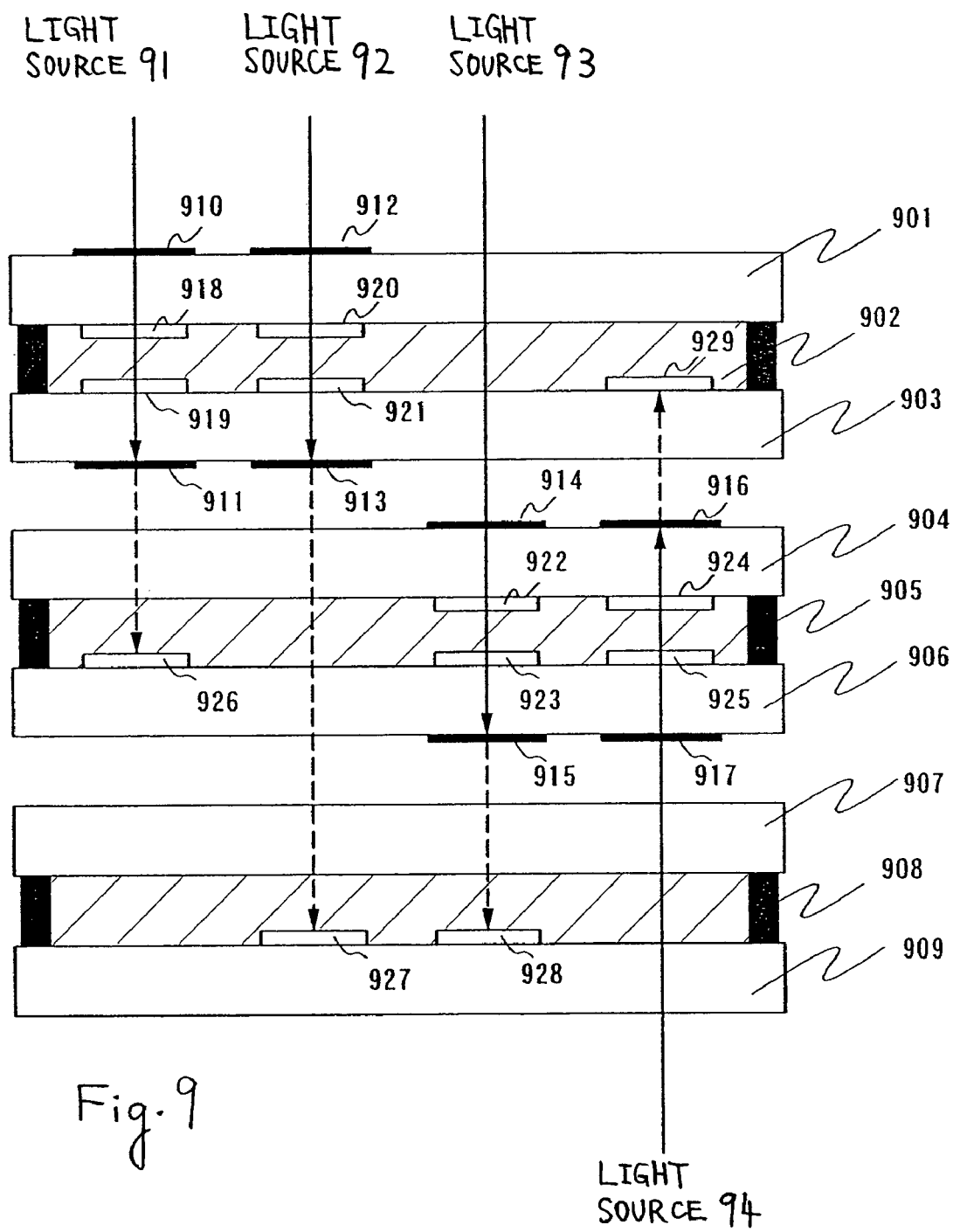
FIG. 9 is a diagram showing a signal input section of the present invention.
Figure 10:
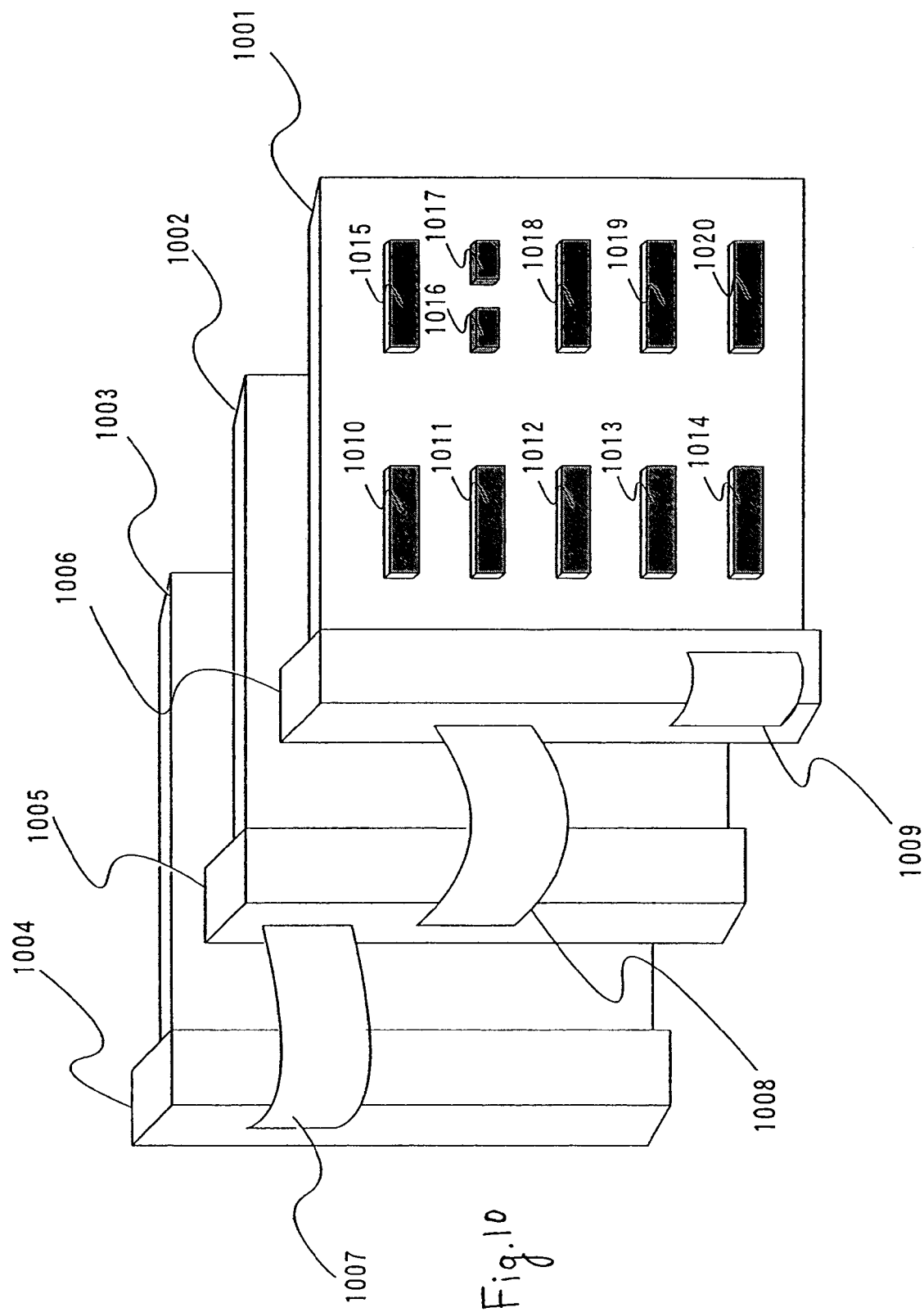
FIG. 10 is a diagram showing a conventional electronic circuit device.

FIG. 9 shows Example in which signals are exchanged between transparent substrates. The light emitted from the light source 92 is inputted into an optical shutter configured with deflection plates 912, 913, a liquid crystal 902, and electrodes 920, 921. The potential of the electrode 921 is controlled by a circuit configured on the transparent substrate 903, thereby controlling the transmission and interruption of the light. In the case where the light has been transmitted through the optical shutter, the light is inputted into an optical sensor 927 disposed on the transparent substrate 909, converted into an electric signal, and the signal processing is performed by a circuit disposed on the transparent substrate 909.

The light emitted from a light source 93 is inputted into an optical shutter configured with deflection plates 914, 915, a liquid crystal 905 and electrodes 922, 923. The potential of the electrode 923 is controlled by a circuit formed on the transparent substrate 906, thereby controlling the transmission and interruption of the light. In the case where the light has been transmitted through the optical shutter, the light is inputted into the optical sensor 928 disposed on the transparent substrate 909, converted into an electric signal, and the signal processing is performed by a circuit disposed on the transparent substrate 909.

The light emitted from the light source 94 is inputted into an optical shutter configured with a deflection plates 916, 917, a liquid crystal 905, electrodes 924, 925. The potential of the electrode 925 is controlled by a circuit configured on the transparent substrate 906, thereby controlling the transmission and interruption of the light. In the case where the light has been transmitted through the optical shutter, the light is inputted into the optical sensor 929 disposed on the transparent substrate 903, converted into an electric signal, and the signal processing is performed by a circuit disposed on the transparent substrate 903.

Example 7

Figure 18:
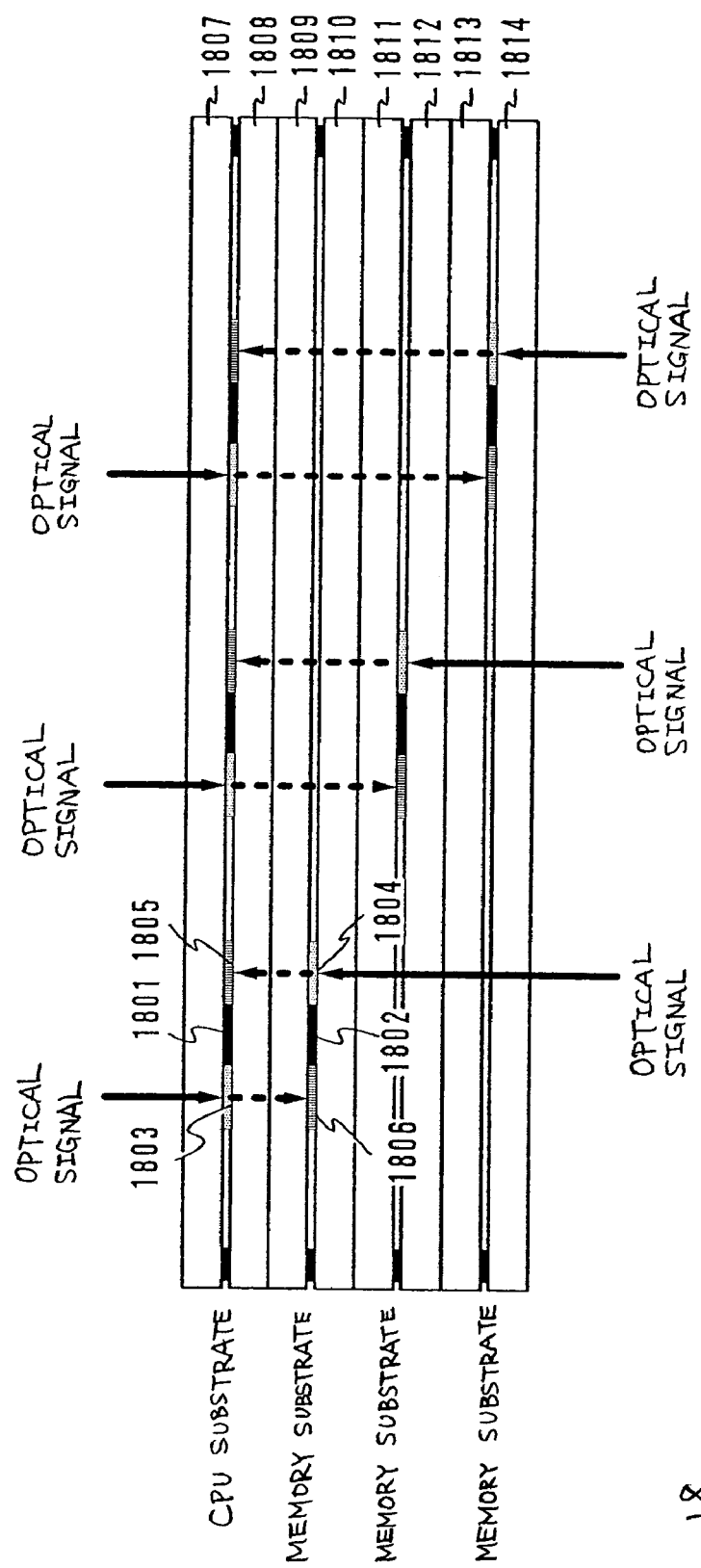
FIG. 18 is a diagram showing an application of the present invention to a computer.

Example of a computer using the present invention is shown in FIG. 18. On transparent substrates 1807-1814, an arithmetic circuit 1801, a memory circuit 1802, an optical shutters 1803, 1804, and optical shutters 1805, 1806 and the like are disposed. In the present invention, as described above, since the connection between substrates at any position on the substrate is capable of being performed using an optical signal, the exchange of a signal is capable of being carried out without being limited by the layout of the substrates. As for the connection between the arithmetic circuit and the memory circuit, the exchange of a signal is capable of being carried out without using the external bus wirings. Moreover, the number of exchanges between the substrates can be also markedly increased comparing to that of the conventional exchanges using print substrates. In this way, by utilizing the present invention, a massively parallel processing computer is capable of being configured.

As shown in FIG. 18, since all of the outputs of memory circuits and the like can be outputted in the orthogonal direction with respect to the transparent substrate in a parallel processing computer using the present invention, the conventional failures in taking out the memory contents in serial order, that is, for example, such problems as the frequency increasing, a circuit for calling becoming complex and the like can be solved.

As described above up to this point, in the present invention, an electronic circuit is formed with a TFT (Thin Film Transistor) on a transparent substrate made of glass or plastic, not on a print substrate, and the electromagnetic noises generated from a signal line of an electric circuit are capable of being reduced by utilizing an optical signal, not using an electric signal for inputting and outputting a signal. Moreover, conventionally, the input and output of a signal have been performed into and from the periphery of the substrate, however, in the present invention, since the input and output of a signal has been capable of being performed into and from any position on the substrate by transmitting an optical signal, the parallel processing of the signal is capable of being carried out. In this way, the present invention has an effect of being capable of performing more parallel processes by means of optical signals.

What is claimed is:

1. An electronic circuit device comprising:
    a first external light source;
    a second external light source;
    a first substrate provided between said first external light source and said second external light source;
    a first optical shutter provided over said first substrate;
    a second substrate provided adjacent to said first substrate so that said first substrate is provided between said first external light source and said second substrate;
    a second optical shutter provided between said first substrate and said second substrate;
    a third substrate provided between said second substrate and said second external light source;
    a first optical sensor provided between said third substrate and said second substrate;
    a second optical sensor provided over said first substrate;
    a first electronic circuit provided between said third substrate and said second substrate; and
    a second electronic circuit provided over said first substrate,
    wherein a first light emitted from said first external light source is inputted into said first optical shutter, and transmission and non-transmission of said first light are controlled by said first optical shutter,
    wherein in a case where said first optical shutter transmits said first light, the transmitted first light is inputted into said first optical sensor and is converted into a first electric signal by said first optical sensor to input said first electric signal into said first electronic circuit,
    wherein a second light emitted from said second external light source is inputted into said second optical shutter, and transmission and non-transmission of said second light are controlled by said second optical shutter, and
    wherein in a case where said second optical shutter transmits said second light, the transmitted second light is inputted into said second optical sensor and is converted into a second electric signal by said second optical sensor to input said second electric signal into said second electronic circuit.

2. A device according to claim 1, wherein at least one of said first electronic circuit and said second electronic circuit comprises a thin film transistor.

3. A device according to claim 1, wherein at least one of said first electronic circuit and said second electronic circuit comprises a thin film transistor and a single crystal IC (Integrated Circuit) chip.

4. A device according to claim 1, wherein at least one of said first optical sensor and said second optical sensor is an amorphous silicon photodiode, or an amorphous silicon phototransistor.

5. A device according to claim 1, wherein at least one of said first optical shutter and said second optical shutter comprises a liquid crystal which is sandwiched between two sheets of transparent substrates.

6. An electronic circuit device comprising:
a first external light source;
a second external light source;
a first substrate provided between said first external light source and said second external light source;
a first optical shutter provided over said first substrate;
a second substrate provided adjacent to said first substrate so that said first substrate is provided between said first external light source and said second substrate;
a second optical shutter provided between said first substrate and said second substrate;
a third substrate provided between said second substrate and said second external light source;
a first optical sensor provided between said third substrate and said second substrate;
a second optical sensor provided over said first substrate;
a first electronic circuit provided between said third substrate and said second substrate; and
a second electronic circuit provided over said first substrate,
wherein a first light emitted from said first external light source is inputted into said first optical shutter, and transmission and non-transmission of said first light are controlled by said first optical shutter,
wherein in a case where said first optical shutter transmits said first light, the transmitted first light is inputted into said first optical sensor and is converted into a first electric signal by said first optical sensor to input said first electric signal into said first electronic circuit,
wherein a second light emitted from said second external light source is inputted into said second optical shutter, and transmission and non-transmission of said second light are controlled by said second optical shutter,
wherein in a case where said second optical shutter transmits said second light, the transmitted second light is inputted into said second optical sensor and is converted into a second electric signal by said second optical sensor to input said second electric signal into said second electronic circuit, and
wherein said first substrate and said second substrate and said third substrate are laminated on each other.

7. A device according to claim 6, wherein at least one of said first electronic circuit and said second electronic circuit comprises a thin film transistor.

8. A device according to claim 6, wherein at least one of said first electronic circuit and said second electronic circuit comprises a thin film transistor and a single crystal IC (Integrated Circuit) chip.

9. A device according to claim 6, wherein at least one of said first optical sensor and said second optical sensor is an amorphous silicon photodiode, or an amorphous silicon phototransistor.

10. A device according to claim 6, wherein at least one of said first optical shutter and said second optical shutter comprises a liquid crystal which is sandwiched between two sheets of transparent substrates.

11. An electronic circuit device comprising:
a first external light source;
a second external light source;
a first substrate provided between said first external light source and said second external light source;
a first optical shutter provided over said first substrate;
a second substrate provided adjacent to said first substrate so that said first substrate is provided between said first external light source and said second substrate;
a second optical shutter provided between said first substrate and said second substrate;
a third substrate provided between said second substrate and said second external light source;
a first optical sensor provided between said third substrate and said second substrate;
a second optical sensor provided over said first substrate;
a first electronic circuit provided between said third substrate and said second substrate; and
a second electronic circuit provided over said first substrate,
wherein a first light emitted from said first external light source is inputted into said first optical shutter, and transmission and non-transmission of said first light are controlled by said first optical shutter,
wherein in a case where said first optical shutter transmits said first light, the transmitted first light is inputted into said first optical sensor and is converted into a first electric signal by said first optical sensor to input said first electric signal into said first electronic circuit,
wherein a second light emitted from said second external light source is inputted into said second optical shutter, and transmission and non-transmission of said second light are controlled by said second optical shutter,
wherein in a case where said second optical shutter transmits said second light, the transmitted second light is inputted into said second optical sensor and is converted into a second electric signal by said second optical sensor to input said second electric signal into said second electronic circuit,
wherein at least one of said first optical sensor and said second optical sensor comprises a thin film transistor for reset, and a cathode electrode, and an anode electrode, and an amorphous film provided between said cathode electrode and said anode electrode,
wherein said thin film transistor for reset comprises a semiconductor film, and a gate electrode provided adjacent to said semiconductor film with a gate insulating film therebetween, and
wherein said cathode electrode is connected with said semiconductor film.

12. A device according to claim 11, wherein at least one of said first electronic circuit and said second electronic circuit comprises a thin film transistor.

13. A device according to claim 11, wherein at least one of said first electronic circuit and said second electronic circuit comprises a thin film transistor and a single crystal IC (Integrated Circuit) chip.

14. A device according to claim 11, wherein at least one of said first optical shutter and said second optical shutter comprises a liquid crystal which is sandwiched between two sheets of transparent substrates.

* * * * *